US011476869B2

(12) United States Patent
Ambardekar et al.

(10) Patent No.: US 11,476,869 B2
(45) Date of Patent: Oct. 18, 2022

(54) DYNAMICALLY PARTITIONING WORKLOAD IN A DEEP NEURAL NETWORK MODULE TO REDUCE POWER CONSUMPTION

(71) Applicant: Microsoft Technology Licensing, LLC, Redmond, WA (US)

(72) Inventors: Amol Ashok Ambardekar, Redmond, WA (US); Boris Bobrov, Kirkland, WA (US); Chad Balling McBride, North Bend, WA (US); George Petre, Redmond, WA (US); Kent D. Cedola, Bellevue, WA (US); Larry Marvin Wall, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 1081 days.

(21) Appl. No.: 15/953,330

(22) Filed: Apr. 13, 2018

(65) Prior Publication Data
US 2018/0300616 A1    Oct. 18, 2018

Related U.S. Application Data

(60) Provisional application No. 62/486,432, filed on Apr. 17, 2017.

(51) Int. Cl.
*G06N 3/04*     (2006.01)
*G06N 3/063*    (2006.01)
(Continued)

(52) U.S. Cl.
CPC .......... *H03M 7/3059* (2013.01); *G06F 1/324* (2013.01); *G06F 1/3275* (2013.01);
(Continued)

(58) Field of Classification Search
CPC .............. G06N 3/04; G06N 3/06; G06N 3/08; G06N 3/063; G06F 9/3885; G06F 9/3887
See application file for complete search history.

(56) References Cited

U.S. PATENT DOCUMENTS

| 4,298,954 | A | 11/1981 | Bigelow et al. |
| 5,091,864 | A | 2/1992 | Baji et al. |
| 5,487,153 | A | 1/1996 | Hammerstrom et al. |
| 5,524,175 | A | 6/1996 | Sato et al. |

(Continued)

FOREIGN PATENT DOCUMENTS

| EP | 0147857 A2 | 7/1985 |
| EP | 2945290 A2 | 11/2015 |

(Continued)

OTHER PUBLICATIONS

Shen, Yongming, Michael Ferdman, and Peter Milder. "Maximizing CNN Accelerator Efficiency Through Resource Partitioning." arXiv preprint arXiv: 1607.00064 (2016). (Year: 2016).*

(Continued)

*Primary Examiner* — Benjamin P Geib
(74) *Attorney, Agent, or Firm* — Newport IP, LLC; Han K. Gim

(57) ABSTRACT

A deep neural network (DNN) module is disclosed that can dynamically partition neuron workload to reduce power consumption. The DNN module includes neurons and a group partitioner and scheduler unit. The group partitioner and scheduler unit divides a workload for the neurons into partitions in order to maximize the number of neurons that can simultaneously process the workload. The group partitioner and scheduler unit then assigns a group of neurons to each of the partitions. The groups of neurons in the DNN module process the workload in their assigned partition to generate a partial output value. The neurons in each group can then sum their partial output values to generate a final (Continued)

US 11,476,869 B2

Page 2 output value for the workload. The neurons can be powered down once the groups of neurons have completed processing their assigned workload to reduce power consumption.

18 Claims, 16 Drawing Sheets

(51) Int. Cl.
| | |
|---|---|
| *G06N 3/08* | (2006.01) |
| *H03M 7/30* | (2006.01) |
| *G06F 12/0862* | (2016.01) |
| *G06F 12/10* | (2016.01) |
| *G06F 3/06* | (2006.01) |
| *G06F 9/38* | (2018.01) |
| *G06N 3/10* | (2006.01) |
| *G06F 9/46* | (2006.01) |
| *G06F 1/324* | (2019.01) |
| *G06F 12/08* | (2016.01) |
| *G06F 15/80* | (2006.01) |
| *G06F 17/15* | (2006.01) |
| *G06N 3/06* | (2006.01) |
| *H04L 45/02* | (2022.01) |
| *H04L 67/02* | (2022.01) |
| *G06F 9/30* | (2018.01) |
| *H04L 67/1001* | (2022.01) |
| *G06F 9/48* | (2006.01) |
| *G06F 12/02* | (2006.01) |
| *G06F 13/16* | (2006.01) |
| *G06F 1/3234* | (2019.01) |
| *G06F 13/28* | (2006.01) |
| *H03M 7/46* | (2006.01) |
| *H04L 45/50* | (2022.01) |

(52) U.S. Cl.
CPC ............ *G06F 3/0604* (2013.01); *G06F 3/067* (2013.01); *G06F 3/0631* (2013.01); *G06F 9/30087* (2013.01); *G06F 9/3836* (2013.01); *G06F 9/3887* (2013.01); *G06F 9/46* (2013.01); *G06F 9/4881* (2013.01); *G06F 12/0207* (2013.01); *G06F 12/0238* (2013.01); *G06F 12/08* (2013.01); *G06F 12/0862* (2013.01); *G06F 12/10* (2013.01); *G06F 13/1673* (2013.01); *G06F 13/1689* (2013.01); *G06F 13/28* (2013.01); *G06F 15/8007* (2013.01); *G06F 17/15* (2013.01); *G06N 3/04* (2013.01); *G06N 3/049* (2013.01); *G06N 3/0454* (2013.01); *G06N 3/06* (2013.01); *G06N 3/063* (2013.01); *G06N 3/0635* (2013.01); *G06N 3/08* (2013.01); *G06N 3/10* (2013.01); *H03M 7/6005* (2013.01); *H03M 7/6011* (2013.01); *H03M 7/70* (2013.01); *H04L 45/04* (2013.01); *H04L 67/02* (2013.01); *H04L 67/1001* (2022.05); *G06F 2209/484* (2013.01); *G06F 2209/485* (2013.01); *G06F 2212/657* (2013.01); *H03M 7/46* (2013.01); *H04L 45/50* (2013.01); *Y02D 10/00* (2018.01)

(56) References Cited

U.S. PATENT DOCUMENTS

| | | | |
|---|---|---|---|
| 5,644,749 A | 7/1997 | Obayashi | |
| 5,859,990 A | 1/1999 | Yarch | |
| 5,933,654 A | 8/1999 | Galdun et al. | |
| 6,307,867 B1 | 10/2001 | Roobol et al. | |
| 6,654,730 B1 | 11/2003 | Kato et al. | |
| 6,785,239 B1 | 8/2004 | Tasker | |
| 6,990,079 B2 | 1/2006 | Vrabel | |
| 7,012,893 B2 | 3/2006 | Bahadiroglu | |
| 7,137,021 B2* | 11/2006 | Dhong | G06F 9/30014 713/324 |
| 7,480,640 B1 | 1/2009 | Elad et al. | |
| 7,539,608 B1 | 5/2009 | Dageville et al. | |
| 7,694,084 B2 | 4/2010 | Raghavan et al. | |
| 8,244,953 B1 | 8/2012 | Kumar | |
| 8,442,927 B2 | 5/2013 | Chakradhar et al. | |
| 8,892,488 B2 | 11/2014 | Qi et al. | |
| 8,966,413 B2 | 2/2015 | Shacham et al. | |
| 9,015,096 B2 | 4/2015 | Hunzinger | |
| 9,143,393 B1 | 9/2015 | Bird et al. | |
| 9,378,044 B1 | 6/2016 | Gaurav et al. | |
| 9,851,771 B2 | 12/2017 | Cooper et al. | |
| 9,990,307 B1 | 6/2018 | Patel et al. | |
| 10,169,296 B2* | 1/2019 | Korthikanti | G06F 17/16 |
| 10,275,001 B2 | 4/2019 | Kam et al. | |
| 2002/0133648 A1 | 9/2002 | Goudie et al. | |
| 2003/0065631 A1 | 4/2003 | Mcbride | |
| 2003/0120799 A1 | 6/2003 | Lahav et al. | |
| 2003/0200315 A1 | 10/2003 | Goldenberg et al. | |
| 2004/0187135 A1 | 9/2004 | Pronovost et al. | |
| 2005/0204189 A1 | 9/2005 | Akiba | |
| 2005/0216616 A1 | 9/2005 | Eldar et al. | |
| 2006/0047864 A1 | 3/2006 | Brokenshire et al. | |
| 2007/0145151 A1 | 6/2007 | Nakamura et al. | |
| 2008/0043742 A1 | 2/2008 | Pong et al. | |
| 2008/0052441 A1 | 2/2008 | Freking et al. | |
| 2008/0112438 A1 | 5/2008 | Ying et al. | |
| 2008/0313385 A1 | 12/2008 | Vijayakumar et al. | |
| 2008/0319933 A1 | 12/2008 | Moussa et al. | |
| 2009/0037697 A1 | 2/2009 | Ramani et al. | |
| 2009/0313195 A1 | 12/2009 | Mcdaid et al. | |
| 2010/0180100 A1 | 7/2010 | Lu et al. | |
| 2010/0257174 A1 | 10/2010 | Minuti | |
| 2010/0281192 A1 | 11/2010 | Rakib et al. | |
| 2011/0246722 A1 | 10/2011 | Taha et al. | |
| 2012/0130928 A1 | 5/2012 | Bell et al. | |
| 2012/0134449 A1 | 5/2012 | Chen et al. | |
| 2014/0046882 A1 | 2/2014 | Wood | |
| 2014/0181464 A1 | 6/2014 | Forsyth et al. | |
| 2014/0281221 A1 | 9/2014 | Wang et al. | |
| 2014/0372670 A1 | 12/2014 | Vasilyuk | |
| 2015/0363239 A1 | 12/2015 | Hsu et al. | |
| 2016/0098388 A1 | 4/2016 | Blevins et al. | |
| 2016/0184587 A1 | 6/2016 | Heuvel et al. | |
| 2016/0267377 A1 | 9/2016 | Pan et al. | |
| 2016/0328644 A1 | 11/2016 | Lin et al. | |
| 2016/0335119 A1* | 11/2016 | Merrill | G06N 3/063 |
| 2016/0350653 A1 | 12/2016 | Socher et al. | |
| 2017/0011288 A1 | 1/2017 | Brothers et al. | |
| 2017/0199902 A1 | 7/2017 | Mishra et al. | |
| 2018/0299943 A1 | 10/2018 | Mcbride et al. | |
| 2018/0300601 A1 | 10/2018 | Cedola et al. | |
| 2018/0300602 A1 | 10/2018 | Petre et al. | |
| 2018/0300603 A1 | 10/2018 | Ambardekar et al. | |
| 2018/0300604 A1 | 10/2018 | Mcbride et al. | |
| 2018/0300605 A1 | 10/2018 | Ambardekar et al. | |
| 2018/0300606 A1 | 10/2018 | Corkery et al. | |
| 2018/0300607 A1 | 10/2018 | Petre et al. | |
| 2018/0300613 A1 | 10/2018 | Petre et al. | |
| 2018/0300614 A1 | 10/2018 | Ambardekar et al. | |
| 2018/0300615 A1 | 10/2018 | Ambardekar et al. | |
| 2018/0300617 A1 | 10/2018 | Mcbride et al. | |
| 2018/0300633 A1 | 10/2018 | Mcbride et al. | |
| 2018/0300634 A1 | 10/2018 | Mcbride et al. | |
| 2020/0233820 A1 | 7/2020 | Mcbride et al. | |

FOREIGN PATENT DOCUMENTS

| | | |
|---|---|---|
| EP | 3035204 A1 | 6/2016 |
| EP | 3035249 A1 | 6/2016 |
| WO | 1993014459 A1 | 7/1993 |
| WO | 2016118257 A1 | 7/2016 |

(56) References Cited

FOREIGN PATENT DOCUMENTS

| WO | 2016210030 A1 | 12/2016 |
|---|---|---|
| WO | 2017062382 A | 4/2017 |

OTHER PUBLICATIONS

Mao, Jiachen, et al. "Modnn: Local distributed mobile computing system for deep neural network." Design, Automation & Test in Europe Conference & Exhibition (DATE), 2017. IEEE. (Year: 2017).*
Kim, Doo Young, et al. "A neural network accelerator for mobile application processors." IEEE Transactions on Consumer Electronics 61.4 (2015): 555-563. (Year: 2015).*
Sharir, Or, and Amnon Shashua. "On the expressive power of overlapping architectures of deep learning." arXiv preprint arXiv:1703.02065 (Mar. 2017). (Year: 2017).*
Chi, et al., "PRIME: A Novel Processing-in-memory Architecture for Neural Network Computation in ReRAM-based Main Memory", In Proceedings of ACM/IEEE 43rd Annual International Symposium on Computer Architecture, vol. 44, Issue 3, Jun. 18, 2016, 13 Pages.
"Non Final Office Action Issued in U.S. Appl. No. 15/702,311", dated May 21, 2019, 12 Pages.
"Notice of Allowance Issued in U.S. Appl. No. 15/702,311", dated Sep. 11, 2019, 6 Pages.
"Final Office Action Issued in U.S. Appl. No. 15/702,311", dated Nov. 5, 2018, 12 Pages.
"International Search Report & Written Opinion Issued in PCT Patent Application No. PCT/US18/027674", dated Jul. 13, 2018, 13 Pages.
"International Search Report & Written Opinion Issued in PCT Patent Application No. PCT/US18/027680", dated Sep. 27, 2018, 13 Pages.
"International Search Report & Written Opinion Issued in PCT Patent Application No. PCT/US18/027828", dated Aug. 3, 2018, 11 Pages.
"International Search Report & Written Opinion Issued in PCT Patent Application No. PCT/US18/027834", dated Jul. 24, 2018, 11 Pages.
"International Search Report & Written Opinion Issued in PCT Patent Application No. PCT/US18/027836", dated Aug. 3, 2018, 14 Pages.
"International Search Report & Written Opinion Issued in PCT Patent Application No. PCT/US18/027837", dated Aug. 3, 2018, 10 Pages.
"International Search Report & Written Opinion Issued in PCT Patent Application No. PCT/US18/027840", dated Jul. 30, 2018, 9 Pages.
"Non Final Office Action Issued In U.S. Appl. No. 15/702,311", dated Jun. 29, 2018, 10 Pages.
"International Search Report and Written Opinion Issued In PCT Application No. PCT/US2018/026358", dated Jul. 11, 2018, 15 Pages.
"International Search Report and Written Opinion Issued In PCT Application No. PCT/US2018/026352", dated Jun. 27, 2018, 11 Pages.
"International Search Report and Written Opinion Issued In PCT Application No. PCT/US2018/026353", dated Jul. 6, 2018, 15 Pages.
"International Search Report and Written Opinion Issued In PCT Application No. PCT/US2018/026354", dated Jul. 31, 2018, 15 Pages.
"International Search Report and Written Opinion Issued In PCT Application No. PCT/US2018/026355", dated Jul. 9, 2018, 16 Pages.
"International Search Report and Written Opinion Issued In PCT Application No. PCT/US2018/026356", dated Jul. 6, 2018, 16 Pages.
"International Search Report and Written Opinion Issued In PCT Application No. PCT/US2018/026357", dated Jul. 9, 2018, 16 Pages.
"Ex Parte Quayle Action Issued in U.S. Appl. No. 15/950,644", Mailed Date: Sep. 23, 2019, 7 Pages.
"Notice of Allowance Issued in U.S. Appl. No. 15/694,663", dated May 8, 2020, 9 Pages.
"Office Action Issued in European Patent Application No. 18722340.9", dated Dec. 20, 2021, 8 Pages.
"Office Action Issued in Indian Patent Application No. 201947036450", dated Feb. 3, 2022, 7 Pages.

* cited by examiner

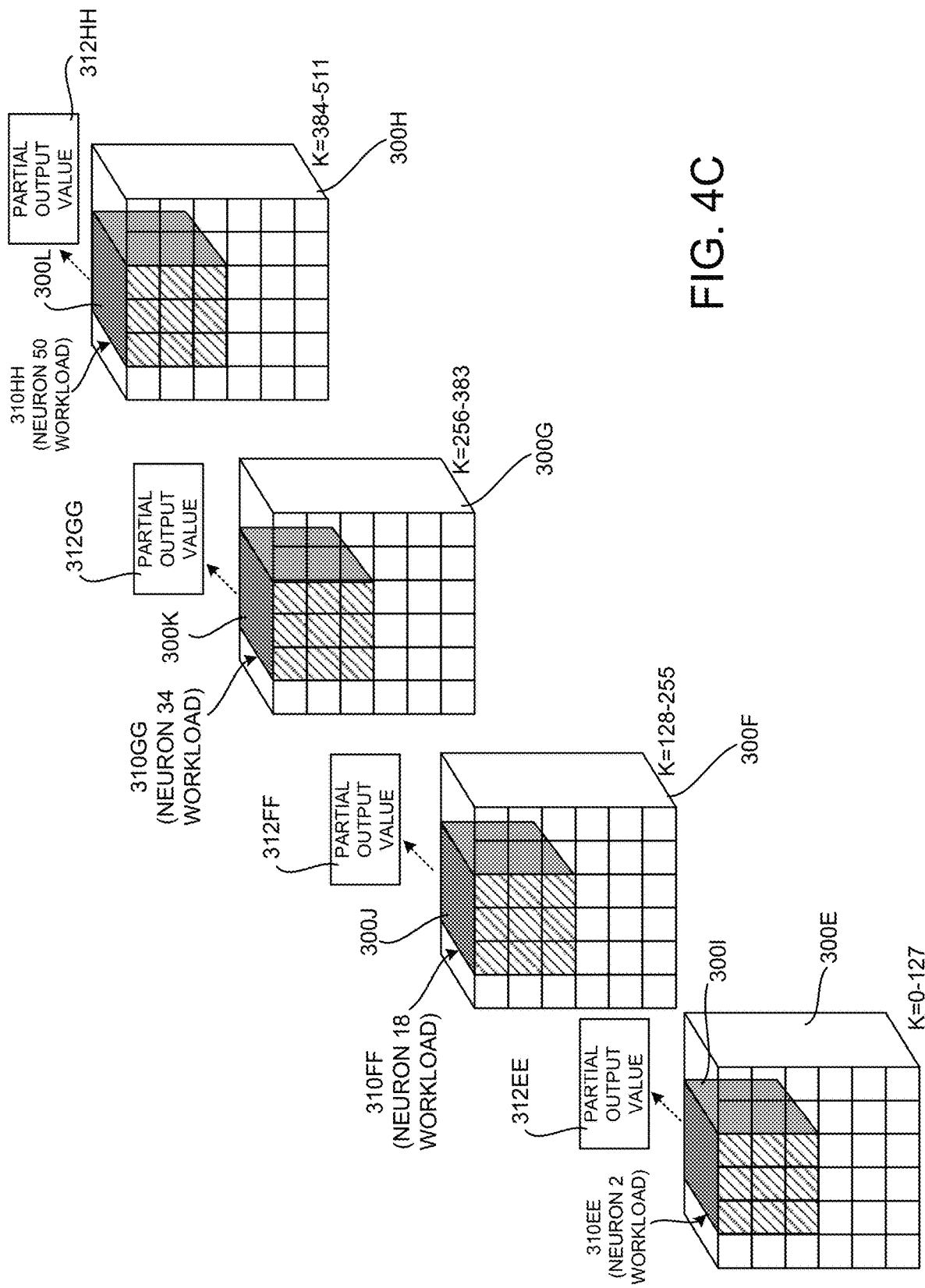

DYNAMICALLY PARTITIONING WORKLOAD IN A DEEP NEURAL NETWORK MODULE TO REDUCE POWER CONSUMPTION

CROSS-REFERENCE TO RELATED APPLICATIONS

This application claims priority under 35 U.S.C. § 119(e) to U.S. Provisional Patent Application No. 62/486,432, filed on Apr. 17, 2017 and titled "Enhanced Neural Network Designs," the entire disclosure of which is expressly incorporated in its entirety by reference herein.

BACKGROUND

Deep neural networks ("DNNs") are loosely modeled after information processing and communication patterns in biological nervous systems, such as the human brain. DNNs can be utilized to solve complex classification problems such as, but not limited to, object detection, semantic labeling, and feature extraction. As a result, DNNs form the foundation for many artificial intelligence ("AI") applications, such as computer vision, speech recognition, and machine translation. DNNs can match or exceed human accuracy in many of these domains.

The high-level of performance of DNNs stems from their ability to extract high-level features from input data after using statistical learning over a large data set to obtain an effective representation of an input space. However, the superior performance of DNNs comes at the cost of high computational complexity. High performance general-purpose processors, such as graphics processing units ("GPUs"), are commonly utilized to provide the high level of computational performance required by many DNN applications.

While general-purpose processors, like GPUs, can provide a high level of computational performance for implementing DNNs, these types of processors are typically unsuitable for use in performing DNN operations over long durations in computing devices where low power consumption is critical. For example, general-purpose processors, such as GPUs, can be unsuitable for use in performing long-running DNN tasks in battery-powered portable devices, like smartphones or alternate/virtual reality ("AR/VR") devices, where the reduced power consumption is required to extend battery life.

Reduced power consumption while performing continuous DNN tasks, such as detection of human movement, can also be important in non-battery-powered devices, such as a power-over-Ethernet ("POE") security camera for example. In this specific example, POE switches can provide only a limited amount of power, and reducing the power consumption of POE devices like security cameras permits the use of POE switches that provide less power.

Application-specific integrated circuits ("ASICs") have been developed that can provide performant DNN processing while at the same time reducing power consumption as compared to general-purpose processors. Despite advances in this area, however, there is a continued need to improve the performance and reduce the power consumption of ASICs that perform DNN processing, particularly for use in computing devices where the low power consumption is critical.

It is with respect to these and other technical challenges that the disclosure made herein is presented.

SUMMARY

A DNN module, or processor, is disclosed that can dynamically partition neuron workload to enable more efficient processing. The neural network module can dynamically partition neuron workload and assign the partitions to groups of neurons for processing in parallel. Because the neurons process the workload in parallel, the neurons can complete their processing faster and be powered off more quickly, thereby saving power. Other technical benefits not specifically mentioned herein can also be realized through implementations of the disclosed subject matter.

In one embodiment disclosed herein, a DNN module includes neurons and a group partitioner and scheduler unit. The group partitioner and scheduler unit can divide a workload for the neurons into partitions in order to maximize the number of neurons that can simultaneously process the workload. The workload can include a portion of an input volume and a weight volume and can be partitioned in various ways. For example, and without limitation, the workload can be partitioned along its height, width, or depth dimension.

The group partitioner and scheduler unit can then assign a group of neurons to each of the partitions. The groups of neurons in the DNN module process the workload in their assigned partitions to generate a partial output value. For example, each group of neurons can perform a convolution operation on a partition containing a portion of the input volume and a portion of the weight volume.

When their processing has completed, the groups of neurons can then sum their partial output values in order to generate final output values for the workload. The generated output values can be stored in memory for future use by the DNN module, provided to an application host, or utilized in other ways.

The neurons can be powered down once the groups of neurons have completed processing their assigned workload. Because the groups of neurons process their assigned workloads simultaneously, processing can complete more quickly as compared to implementations where a single neuron generates an output value. As a result, the neurons can be powered down more quickly, which results in reduced power consumption. Other technical benefits not specifically identified herein can also be realized through implementations of the disclosed technologies.

It should be appreciated that the above-described subject matter can be implemented as a computer-controlled apparatus, a computer-implemented method, a computing device, or as an article of manufacture such as a computer readable medium. These and various other features will be apparent from a reading of the following Detailed Description and a review of the associated drawings.

This Summary is provided to introduce a brief description of some aspects of the disclosed technologies in a simplified form that are further described below in the Detailed Description. This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIG. 4C is a data structure diagram illustrating aspects of the processing of several other illustrative workloads during the illustrative convolution operation using the illustrative partitioning shown in FIG. 4A, according to one embodiment;

DETAILED DESCRIPTION

Figure 1A:
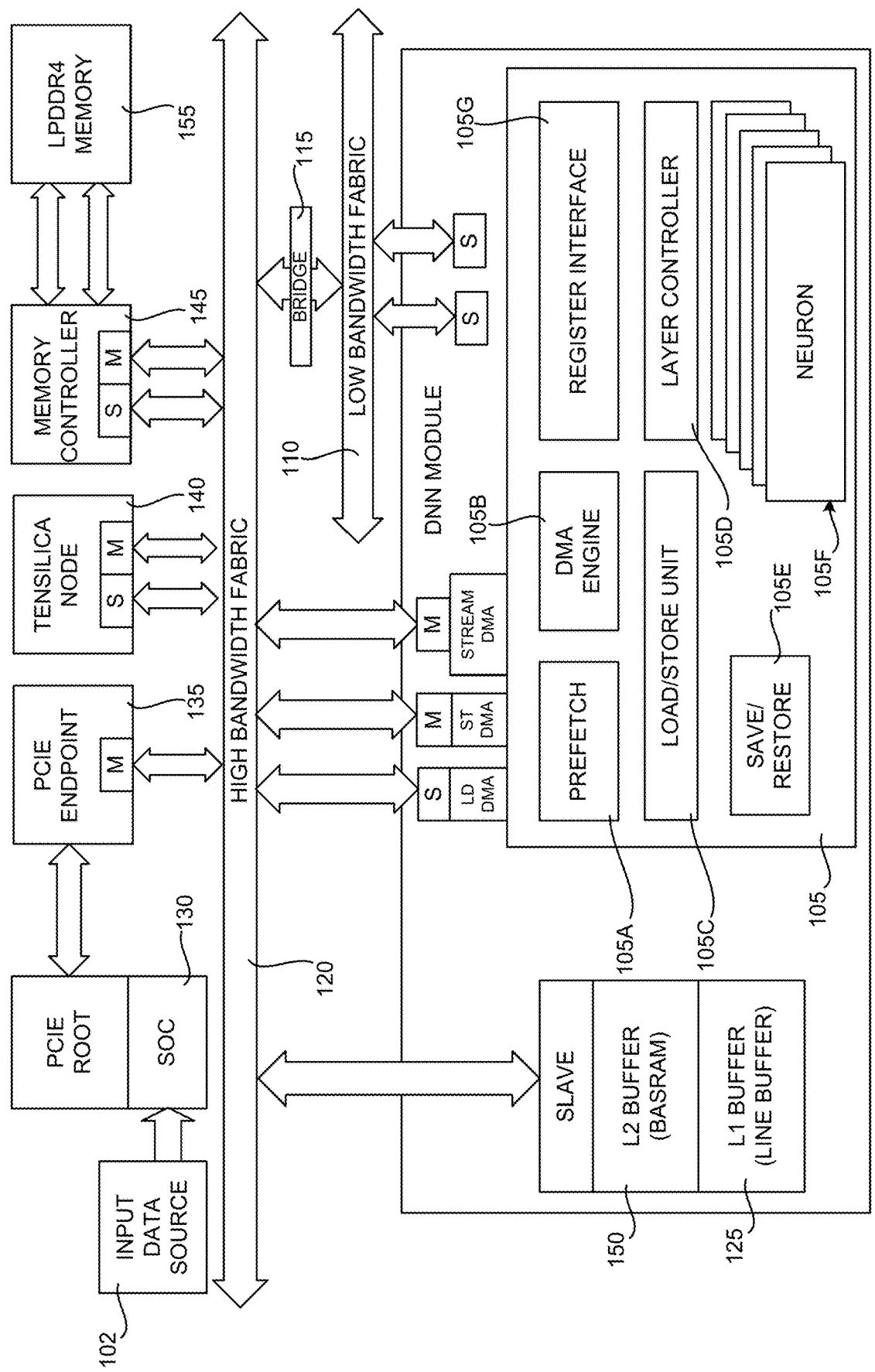
FIGS. 1A and 1B are computing architecture diagrams that show aspects of the configuration and operation of a DNN module that can implement the technologies disclosed herein, according to one embodiment.

The following detailed description is directed to a DNN module that can dynamically partitioning neuron workloads.

As discussed briefly above, implementations of the technologies disclosed herein can provide faster processing and reduced power consumption. Other technical benefits not specifically mentioned herein can also be realized through implementations of the disclosed subject matter.

While the subject matter described herein is presented in the general context of a hardware DNN module, those skilled in the art will recognize that other implementations can be performed in combination with other types of computing systems and modules. Those skilled in the art will also appreciate that the subject matter described herein can be practiced with other computer system configurations, including hand-held devices, multiprocessor systems, microprocessor-based or programmable consumer electronics, computing or processing systems embedded in devices (such as wearable computing devices, automobiles, home automation etc.), minicomputers, mainframe computers, and the like.

In the following detailed description, references are made to the accompanying drawings that form a part hereof, and which are shown by way of illustration specific configurations or examples. Referring now to the drawings, in which like numerals represent like elements throughout the several FIGS., aspects of a DNN module that can partition neuron workload to reduce power consumption will be described.

FIG. 1A is a computing architecture diagram that shows aspects of the configuration and operation of a deep neural network ("DNN") module 105 that implements the technologies disclosed herein, according to one embodiment. The DNN module 105 disclosed herein is configured in some embodiments to solve classification problems (and related problems) such as, but not limited to, object detection, semantic labeling, and feature extraction.

In order to provide this functionality, the DNN module 105 can implement a recall-only neural network and programmatically support a wide variety of network structures. Training for the network implemented by the DNN module 105 can be performed offline in a server farm, data center, or another suitable computing environment. The result of training a DNN is a set of parameters that can be known as "weights" or "kernels." These parameters represent a transform function that can be applied to an input with the result being a classification or semantically labeled output.

The DNN module 105 disclosed herein can be considered a superscalar processor. The DNN module 105 can dispatch one or more instructions to multiple execution units, called neurons 105F. The execution units can be "simultaneous dispatch simultaneous complete," where each execution unit is synchronized with each of the other execution units. The DNN module 105 can be classified as a single instruction stream, multiple data stream ("SIMD") architecture.

The DNN module 105 includes a number of neurons 105F (e.g. a power of two). A neuron 105F is the base unit in artificial neural networks that is used to model a biological neuron in the brain. The model of a neuron 105F can include the inner product of an input vector with a weight vector added to a bias, with an activation function applied. The processing performed by a neuron 105F in the DNN module 105 described herein is closely mapped to an artificial neuron.

Each neuron 105F in the DNN module 105 is capable of performing weighted sum, max pooling, bypass, and potentially other types of operations. The neurons 105F process input and weight data every clock cycle. Each neuron 105F can be synchronized to all other neurons 105F in terms of progress within a kernel to minimize the flow of kernel data within the DNN module 105.

Each neuron 105F can contain a multiplier, an adder, a comparator, and a number of accumulators (not shown in FIG. 1A). By having multiple accumulators, the neurons 105F are able to maintain context for multiple different active kernels at a time. Each accumulator is capable of being loaded from a read of the BaSRAM 150 (described below). The accumulators can sum themselves with the contents of other accumulators from other neurons 105F.

The DNN module 105 accepts planar data as input, such as image data. Input to the DNN module 105 is not, however, limited to image data. Rather, the DNN module 105 can operate on any input data presented to the DNN module 105 in a uniform planar format. In one particular embodiment, the DNN module 105 can accept as input multi-planar one-byte or two-byte data frames.

Each input frame can be convolved with an N×K×H×W set of kernels, where N is the number of kernels, K is the number of channels per kernel, H is the height, and W is the width. Convolution is performed on overlapping intervals across the input data where the interval is defined by strides in the X and Y directions. These functions are performed by the neurons 105F and managed by the DNN module 105 and software-visible control registers.

The DNN module 105 supports three main data types: weights; input data/feature maps; and activation data. Input data/feature maps and activation data are, in most cases, two names for the same data with the distinction that when referring to an output of a layer the terms activation data or activation values are used. When referring to the input of a layer the term input data/feature map is used.

The neurons 105F in the DNN module 105 compute a weighted sum of their inputs and pass the weighted sum through an "activation function" or "transfer function." The transfer function commonly has a sigmoid shape but might also take on the form of a piecewise linear function, step function, or another type of function. The activation function allows the neurons 105F to train to a larger set of inputs and desired outputs where classification boundaries are non-linear.

The DNN module 105 operates on a list of layer descriptors that correspond to the layers of a neural network. The list of layer descriptors can be treated by the DNN module 105 as instructions. These descriptors can be pre-fetched from memory into the DNN module 105 and executed in order. The descriptor list acts as a set of instructions to the DNN module 105. Software tools and/or compilers can be executed on devices external to the DNN module 105 to create the descriptor lists that are executed on the DNN module 105.

Generally, there can be two main classes of descriptors: memory-to-memory move ("M2M") descriptors; and operation descriptors. M2M descriptors can be used to move data to/from the main memory to/from a local buffer (i.e. the line buffer 125 described below) for consumption by the operation descriptors. M2M descriptors follow a different execution pipeline than the operation descriptors. The target pipeline for M2M descriptors can be the internal DMA engine 105B or the configuration registers 105G, whereas the target pipeline for the operation descriptors can be the neurons 105F.

Operational descriptors specify a specific operation that the neurons 105F should perform on a data structure located in local static random access memory ("SRAM") memory. The operational descriptors are processed in order and are capable of many different layer operations, at least some of which are described herein.

As illustrated in FIG. 1A, the DNN module 105 has a memory subsystem with a unique L1 and L2 buffer structure. The L1 and L2 buffers shown in FIG. 1 are designed specifically for neural network processing. By way of example, the L2 buffer 150 can maintain a selected storage capacity with a high speed private interface operating at a selected frequency. The L1 buffer 125 can maintain a selected storage capacity that can be split between kernel and activation data. The L1 buffer 125 might be referred to herein as the "line buffer 125," and the L2 buffer 150 might be referred to herein as the BaSRAM 150.

Computational data (i.e. inputs data, weights and activation data) is stored in the BaSRAM 150 row-major in some embodiments. The computational data can be organized as two line buffers, where one line buffer contains input data, which might be referred to herein as the "input buffer," and the other line buffer, which might be referred to herein as the "weight buffer," contains kernel weights. The line buffers are filled from the BaSRAM 150 by the load/store unit 105C. Data is accumulated in each line buffer until it has reached its predetermined capacity. The line buffer data is then copied to a shadow buffer in some embodiments and presented to the neurons 105F.

The DNN module 105 can also comprise a number of other components including, but not limited to, a register interface 105G, a prefetch unit 105A, a save/restore unit 105E, a layer controller 105D, and a register interface 105G. The DNN module 105 can include additional or alternate components in some embodiments.

The DNN module 105 operates in conjunction with other external computing components in some configurations. For example, the DNN module 105 is connected to a host application processor system on chip ("the host SoC") 130 in some embodiments. The DNN module 105 can be connected to the host SoC 130 through a PCIe interface, for example. Appropriate PCIe components, such as the PCIe endpoint 135 can be utilized to enable these connections.

The Host SoC 130 serves as the application processor for the DNN module 105. The main operating system, application, and auxiliary sensor processing are performed by the host SoC 130. The host SoC 130 can also be connected to an input data source 102, such as an external camera, that provides input data, such as image data, to the DNN module 105.

DDR DRAM 155 can also be connected to the host SoC 130 that can be used as the main system memory. This memory is accessible from the host SoC 130 across the high bandwidth fabric 120 (e.g. PCIe bus) by way of a memory controller 145. The high bandwidth fabric 120 provides bidirectional direct memory access ("DMA") small messaging transactions and larger DMA transactions. A bridge 115 and low bandwidth fabric 110 can connect the DNN module 105 to the host SoC 130 for sub-module configuration and other functions.

The DNN module 105 can include a DMA engine 105B that is configured to move data to and from main memory 155. The DMA engine 105B has two channels in some embodiments. One channel is dedicated to fetching operation descriptors while the other channel is dedicated to M2M operations. A DMA descriptor can be embedded in the M2M descriptor. Descriptors in this context are DMA descriptors that are used to move the contents of memory, not to be confused with the operation descriptors described above.

To offload the local BaSRAM memory 150, and to provide more space for input data and weight data, the activation output can optionally be streamed directly to DDR memory 155. When streaming data to DDR memory 155, the DNN module 105 will accumulate enough data for a burst transaction on the high bandwidth fabric 120 and will buffer enough transactions to minimize backpressure on the neurons 105F. Additional details regarding the operation of the DNN module 105 will be provided below.

Figure 1B:
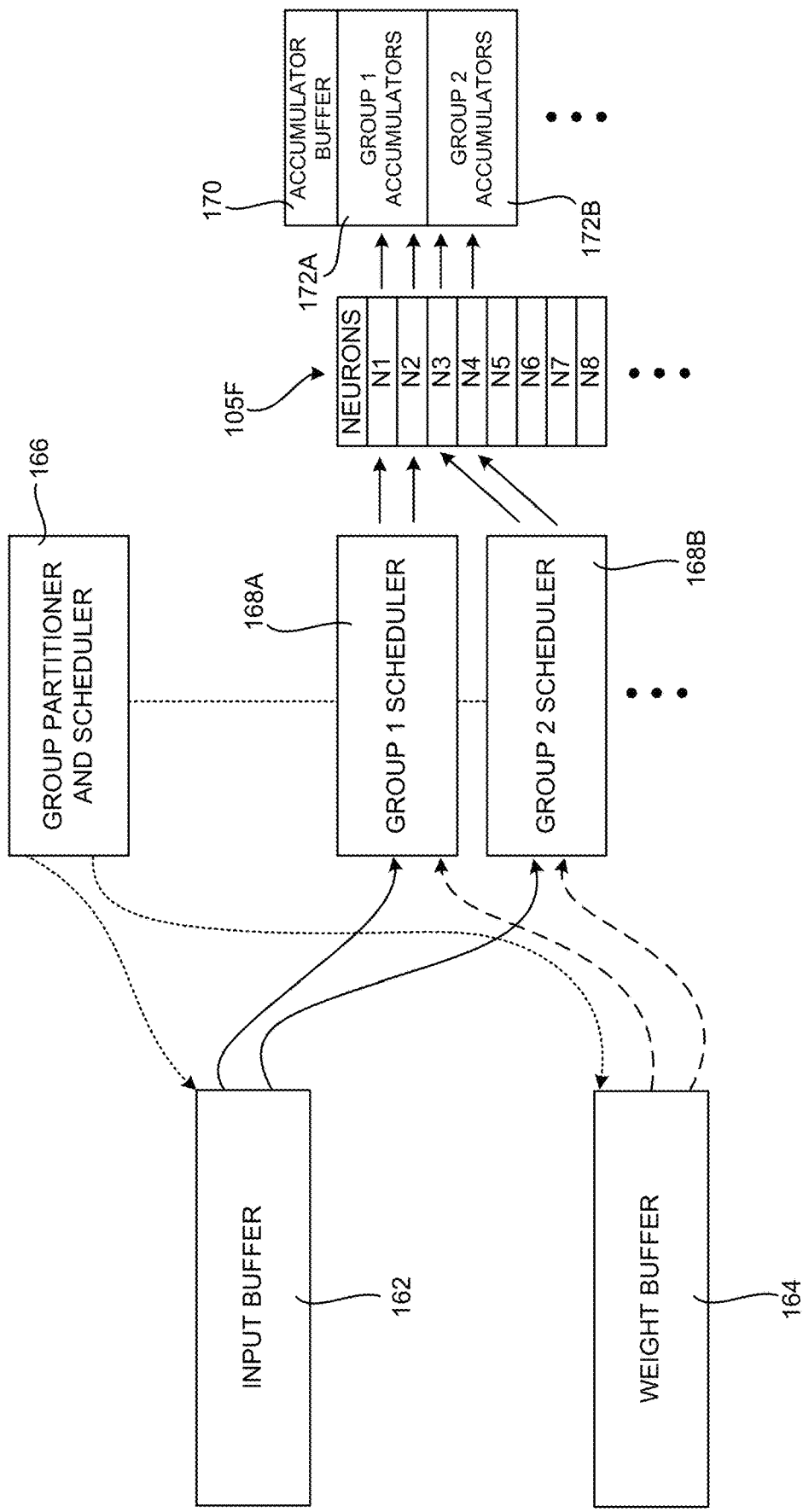

FIG. 1B is a computing architecture diagram showing aspects of the configuration and operation of a neuron buffer, a group partitioner and scheduler 166, group schedulers 168A and 168B, and an accumulator buffer 170, according to one embodiment. In particular, FIG. 1B shows aspects of a portion of the DNN module 105 that is used to optimize processing of an artificial neural network in hardware.

As illustrated in FIG. 1B and discussed briefly above, a set of neurons 105F are coupled to two buffers, or line buffers, in one embodiment where one line buffer contains input data (i.e. the input buffer 162) and the other line buffer contains kernel weights (i.e. the weight cache 204). The input buffer 162 and the weight buffer 164 might be referred to herein collectively as the "neuron buffer." As mentioned above, the line buffers are filled from the BaSRAM 150 by the load/store unit 105C in one embodiment. Data is accumulated in each line buffer until it has reached its predetermined capacity. The line buffer data is then copied to a shadow buffer in some embodiments and presented to the neurons 105F.

In the embodiment illustrated in FIG. 1B, the input buffer 162 and the weight buffer 164 are organized as an N-by-M matrix, where N is the number of rows, which corresponds to the number of neurons 105F, and M is the number of columns, which corresponds to the "width" of the neuron cache (i.e. the number of cycles of data that can be made available to a neuron 105F). The columns of the neuron cache represent the clock cycle in which the data is consumed by the neurons 105F.

In one embodiment there are two copies of each line buffer: a primary copy and a shadow copy. As the memory locations storing the primary copy of the line buffers are being filled, the neurons 105F operate on the shadow copy of the line buffers. Once the memory locations storing the primary copy are filled and the shadow copy of the line buffers is consumed by the neurons 105F, the primary copy data is moved to the shadow copy and the memory locations used to store the primary copy can be filled with the next set of data.

The neurons 105F can process data in the line buffers synchronously or asynchronously in various embodiments disclosed herein. In a synchronous mode of operation, each neuron 105F processes a row from the input buffers, such that one column is selected for processing per clock cycle. In the synchronous mode of operation, the neurons 105F can be organized into a number of groups equal to the number of neurons 105F.

In an asynchronous mode of operation, a set of neurons 105F work on a set of buffer lines (i.e. rows in the neuron cache). In order to enable this functionality, a group partitioner and scheduler 166 works to group the buffer lines and present them to each group scheduler 168A and 168B (collectively "the group schedulers 168"). In one embodiment, the group partitioner and scheduler 166 assigns the buffer lines to the group schedulers 168 using a statically assigned (i.e. predetermined) partition pattern. In other embodiments, some of which are described below, the group partitioner and scheduler 166 assigns the buffer lines to the group schedulers 168 dynamically. Buffer lines can be assigned to the group schedulers 208 in other ways in other embodiments.

After the cache lines have been partitioned, the group partitioner and scheduler 166 assigns the cache lines to a respective group scheduler 168. The group schedulers 168 try to balance the workload within a group of neurons 105F. In the example shown in FIG. 1B, neurons N1 and N2 have been assigned to group one. These neurons can process data from the first two rows of the neuron cache, for example. Neurons N3 and N4 have been assigned to group two. These neurons can process data from the third and fourth rows of the neuron cache, for instance. The group size is shown as two neurons 105F in FIG. 1B for simplicity, but the group size can be any factor of the total number of neurons 105F.

An accumulator buffer 170 is also utilized in some embodiments. In these embodiments, a group of accumulators 172 are assigned to each group of neurons 105F. In the example shown in FIG. 1B, for instance, one group of accumulators 172A has been assigned to the first group of neurons 105F (i.e. neurons N1 and N2) and a second group of accumulators 172B has been assigned to the second group of neurons 105F (i.e. neurons N3 and N4).

Each accumulator 212 is capable of being loaded from a read of the BaSRAM 150. Additionally, the accumulators 172 can sum themselves with the contents of other accumulators assigned to other neurons 105F or neuron groups. As will be discussed in greater detail below, this allows groups of neurons to sum partial output values generated by other groups of neurons in order to calculate a final output value.

Figure 2A:
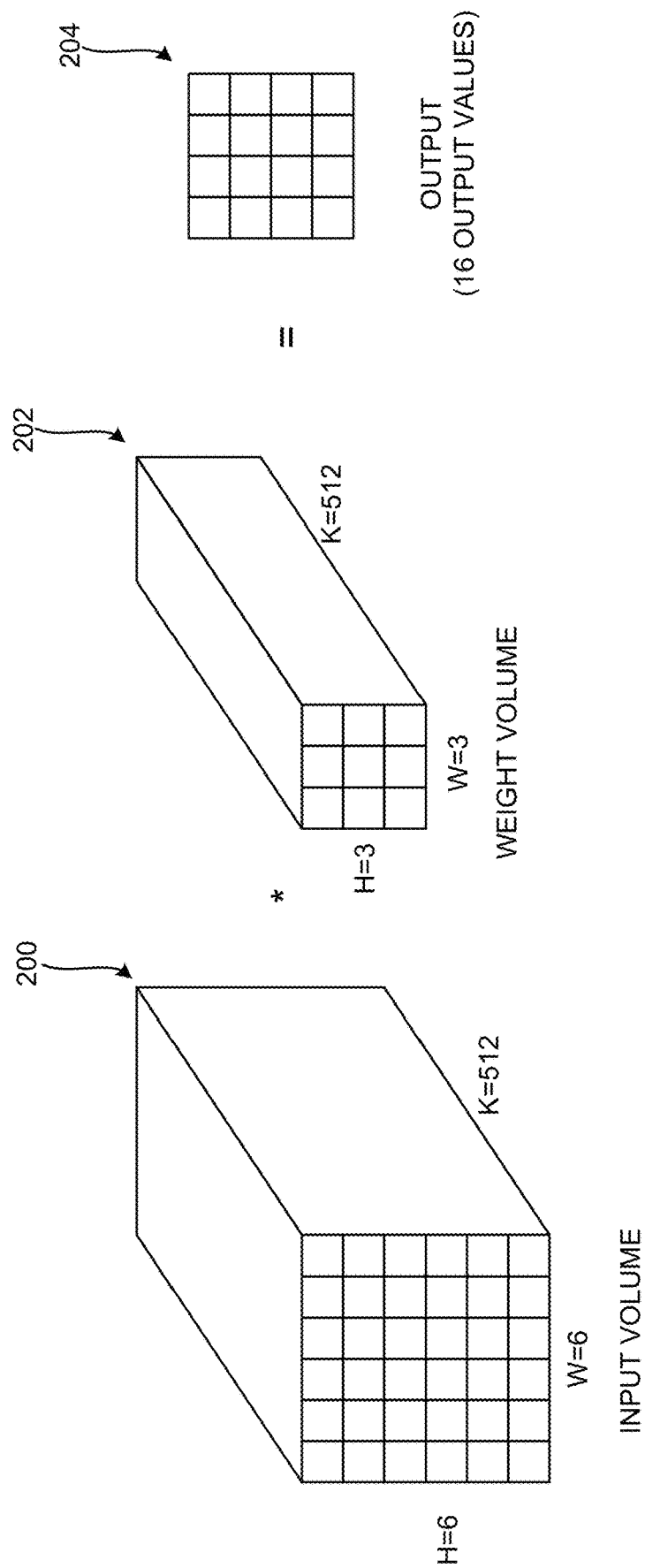
FIG. 2A is a data structure diagram that shows an exemplary input volume, weight volume, and output values for use in illustrating aspects of the operation of the disclosed technologies, according to one embodiment.

FIG. 2A is a data structure diagram that shows an exemplary input volume 200, weight volume 202, and output values 204. The input volume 200, weight volume 202, and output 204 shown in FIG. 2A will be utilized below with reference to FIGS. 2B-4E to illustrate aspects of the operation of the DNN module 105 for partitioning neuron workload. As shown in FIG. 2A, the input volume 200 has a height of six, a width of six, and a depth of 512. The weight volume 202 has a height of three, a width of three, and a depth of 512. The input volume 200 stores input data and the weight volume 202 stores weight, or kernel data.

In the examples described below, the input volume 200 and the weight volume 202 are convolved with a stride width of one to generate an output that includes 16 output values 204. In this regard, it is to be appreciated that the embodiments disclosed herein are not limited to convolution operations and can be utilized to partition an input volume 200 and a weight volume 202 for processing in other ways in other embodiments. It is also to be appreciated that while the example volumes 200 and 202 are three-dimensional, the embodiments disclosed herein can be utilized with one-dimensional, two-dimensional, three-dimensional, or N-dimensional data in a similar fashion.

Figure 2B:
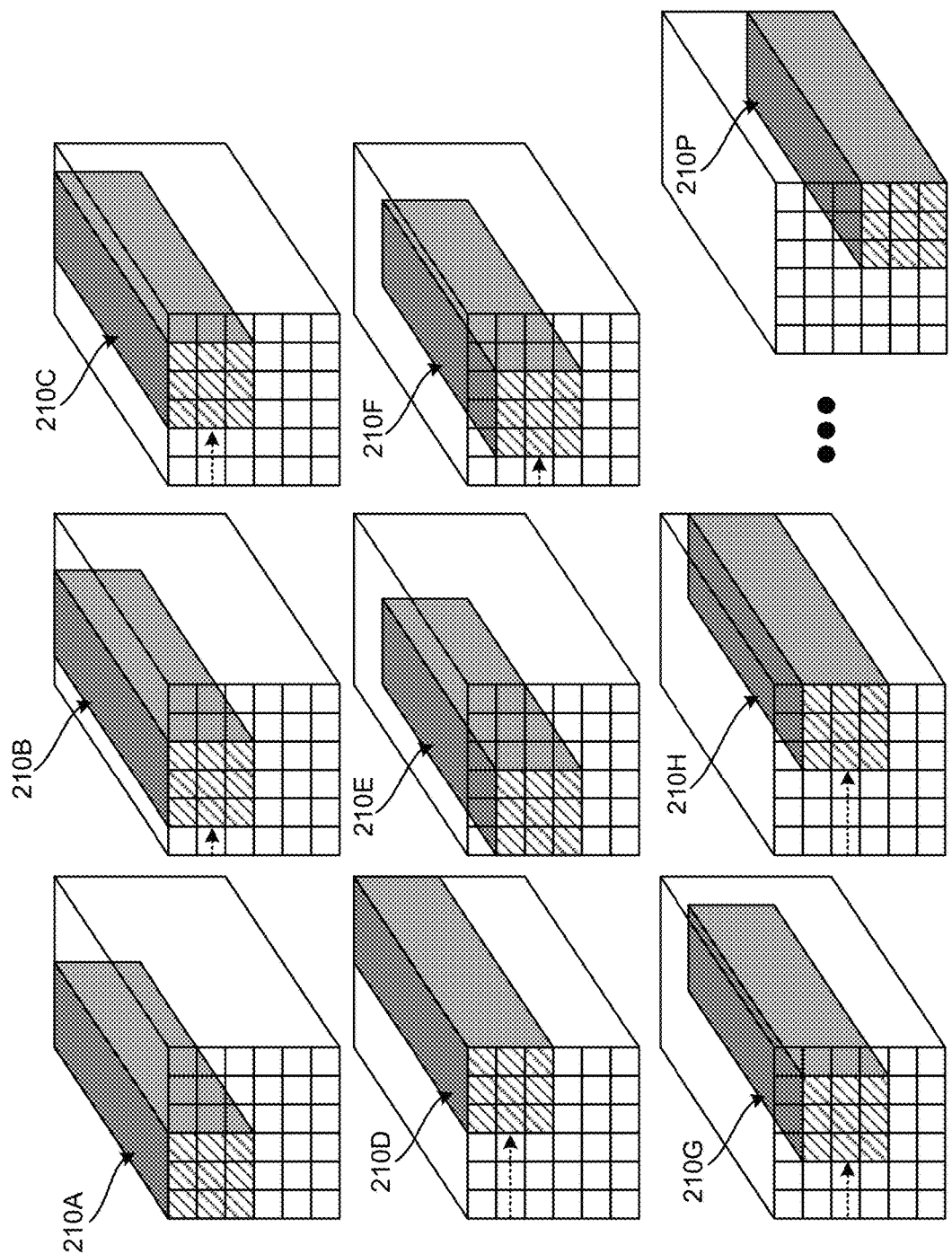
FIG. 2B is a data structure diagram showing aspects of the processing of several illustrative workloads during a convolution operation using the input volume and weight volume shown in FIG. 2A, according to one embodiment.

FIG. 2B is a data structure diagram illustrating aspects of the processing of several illustrative workloads 210 during a convolution operation using the input volume 200 and weight volume 202 shown in FIG. 2A, according to one embodiment. In the example shown in FIG. 2B, a DNN module 105 that has 64 neurons 105F is utilized to convolve the input volume 200 and the weight volume 202 with a stride width of one.

In the example shown in FIG. 2B, one neuron 105F is assigned to generate each output value 204. Accordingly, one neuron 105F of the 64 available neurons 105F performs the workload 210A. Fifteen other neurons 105F individually perform the workloads 210B-210P, respectively. The neurons 105F can process their assigned workload 210 simultaneously and, accordingly, the convolution operation shown in FIG. 2B takes 4,608 cycles (i.e. 3×3×512) to complete.

Because only sixteen neurons 105F of the 64 available neurons 105F are utilized to convolve the input volume 200 and the weight volume 202, 48 neurons remain idle. Even though these neurons 105F are idle, they still consume power. As will be described in greater detail below, the workloads 210 shown in FIG. 2B can be dynamically partitioned and allocated to groups of the neurons 105F for processing in parallel to reduce the power consumption of the neurons 105F.

As will also be described in greater detail below, the number of partitions can be optimized in order to maximize the number of neurons 105F that participate in processing the workload 210. This enables processing of the workload 210 to finish faster than when utilizing the mechanism described above with regard to FIG. 2B where only a single neuron 105F generates each output value 204 and, consequently, enables the neurons 105F to be powered off more quickly, thereby conserving power.

Figure 3A:
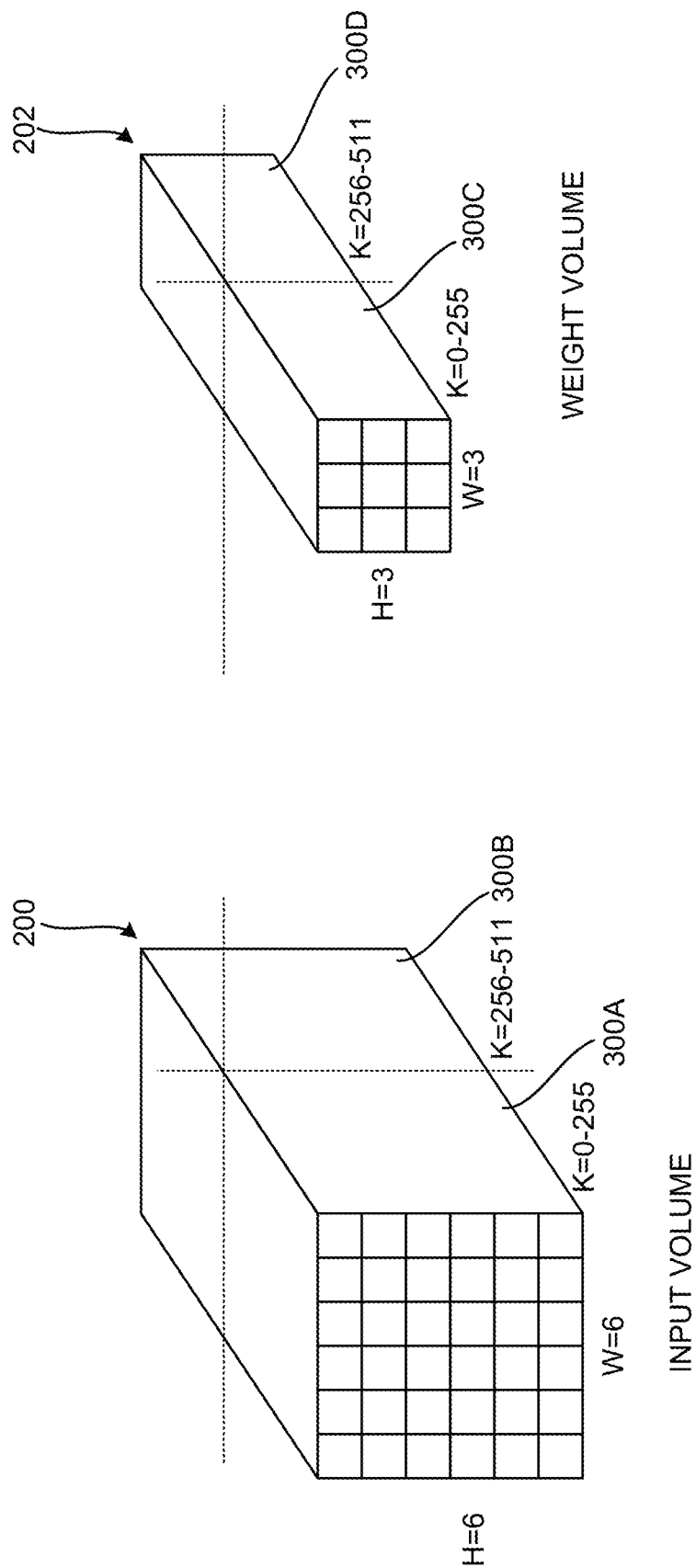
FIG. 3A is a data structure diagram that shows one illustrative partitioning of the exemplary input volume and weight volume shown in FIG. 2A, according to one embodiment.

FIG. 3A is a data structure diagram that shows one illustrative partitioning of the exemplary input volume 200 and weight volume 202 shown in FIG. 2A, according to one embodiment. In this example, the group partitioner and scheduler 166 has divided the input volume equally into two partitions 300A and 300B. The DNN module 105 also has 64 neurons 105F in this example.

The group partitioner and scheduler 166 has also divided the weight volume 202 into two equally-sized partitions 300C and 300D. As will be described in greater detail below with regard to FIGS. 3B-3D, partitioning the input volume 200 and the weight volume 202 in this manner can enable twice as many (i.e. 32) neurons 105F to perform the convolution operation described above with regard to FIG. 2B, thereby resulting in completion of the convolution operation in one-half the time.

Figure 3B:
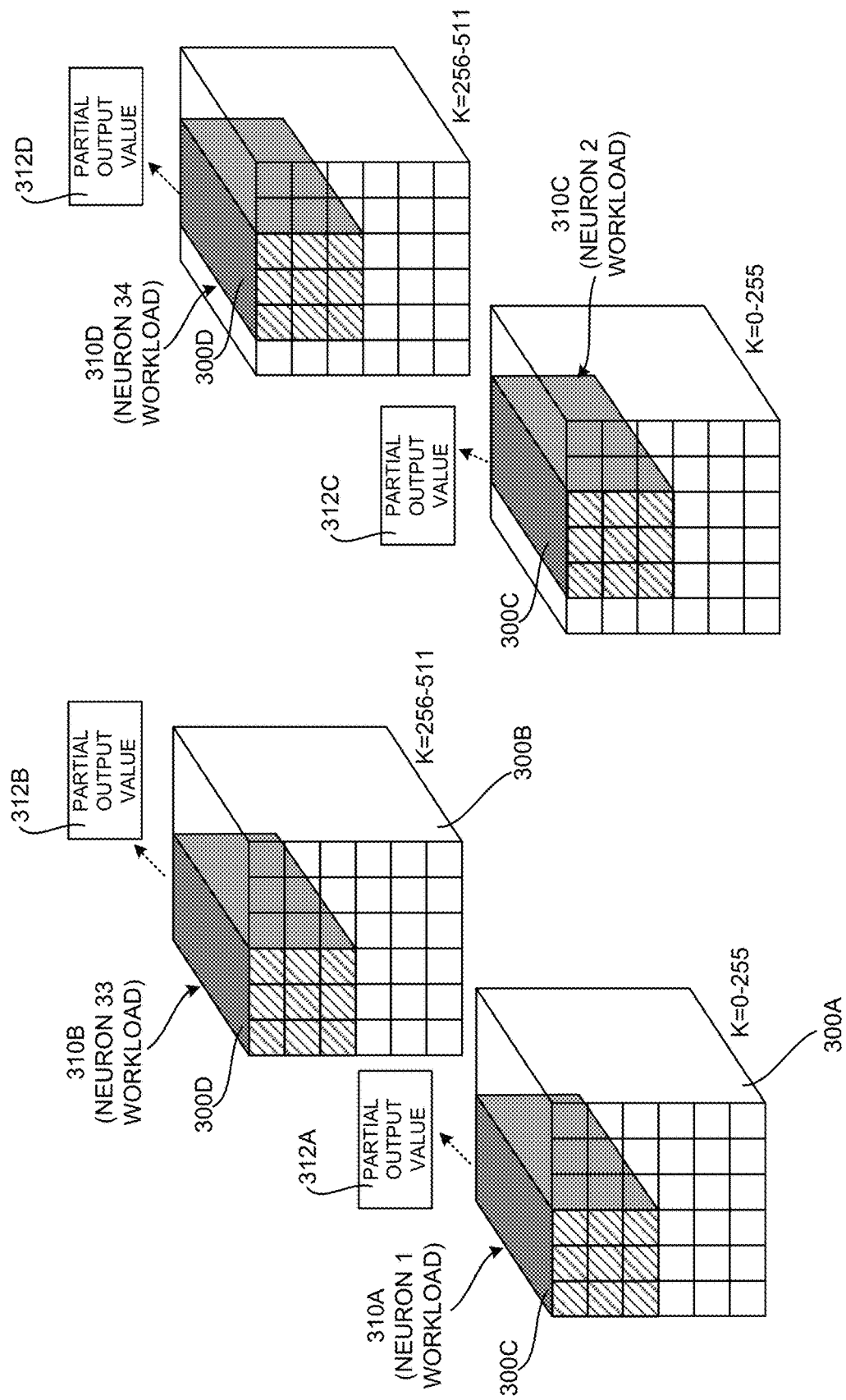
FIG. 3B is a data structure diagram illustrating aspects of the processing of several illustrative workloads during an illustrative convolution operation using the illustrative partitioning shown in FIG. 3A, according to one embodiment.

FIG. 3B is a data structure diagram illustrating aspects of the processing of several illustrative workloads 310 during a convolution operation using the illustrative partitioning shown in FIG. 3A, according to one embodiment. Once the group partitioner and scheduler 166 has partitioned the input volume 200 and the weight volume 202 in the manner shown in FIG. 3B, the group partitioner and scheduler 166 assigns workloads 310 defined by the partitions 300 to groups of the neurons 105F.

Figure 3C:
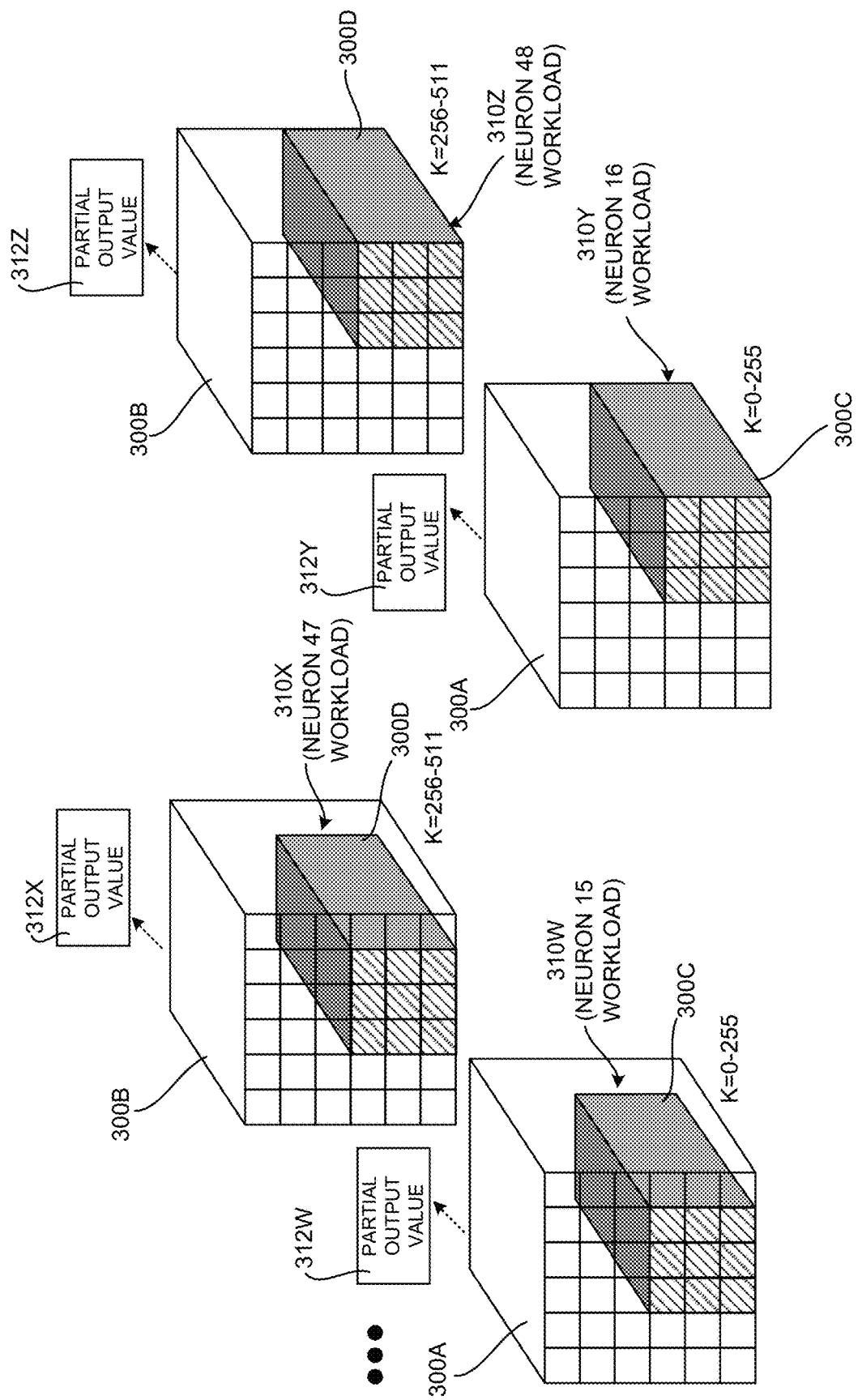
FIG. 3C is a data structure diagram illustrating aspects of the processing of several other illustrative workloads during the illustrative convolution operation using the illustrative partitioning shown in FIG. 3A, according to one embodiment.

In the example shown in FIG. 3B, groups of two neurons 105F are responsible for generating each output value 204. For instance, a group consisting of the first and 33rd neurons 105F has been assigned the workloads 310A and 310B, respectively, in this example. Similarly, a group consisting of the second and $34^{th}$ neurons 105F has been assigned the workloads 310C and 310D, respectively. Other groups of neurons 105F can be assigned workloads in a similar manner to perform the entire convolution operation and generate the 16 output values 204. For instance, and as shown in FIG. 3C, a group consisting of the $15^{th}$ and $47^{th}$ neurons can be assigned the workloads 300C and 300D, and a group consisting of the $16^{th}$ and $48^{th}$ neurons can be assigned the workloads 310Y and 310Z, respectively. In the example shown in FIGS. 3A-3C, neurons 17-32 and 49-64 are not utilized.

As shown in FIGS. 3B and 3C, the processing performed by each neuron 105F in each group of neurons 105F results in a partial output value 312. For example, the workload 310A processed by the first neuron 105F results in the partial output value 312A. Similarly, the workload 310B processed by the $33^{rd}$ neuron 105F results in the partial output value 312B. Likewise, the workloads 310C-310Z result in partial output values 312C-312Z, respectively. A partial output value 312 must be combined with one or more other partial output values 312 to arrive at a final output value 204.

Thirty-two partial output values 312 are generated by the partitioning and processing described above with regard to FIGS. 3B and 3C. Consequently, the partial output values 312 must be combined in order to generate the sixteen output values 204. Details regarding one embodiment of this process are described below with regard to FIG. 3D.

Figure 3D:
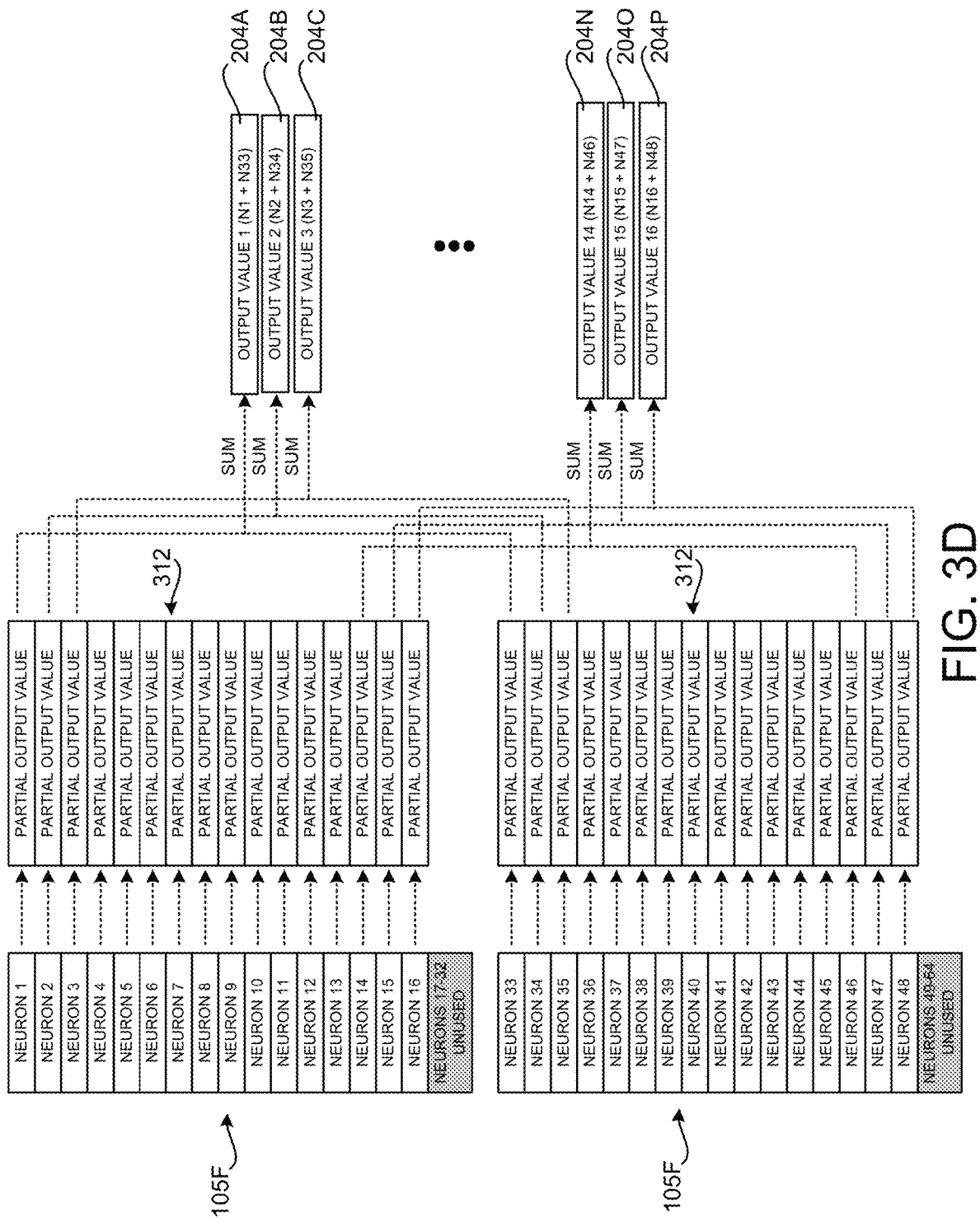
FIG. 3D is a processing diagram illustrating the generation of output values using partial output values generated by the processing of the partitioned workloads described with regard to FIGS. 3B and 3C, according to one embodiment.

FIG. 3D is a processing diagram illustrating the generation of output values 314 using partial output values 312 generated by the processing of the partitioned workloads described with regard to FIGS. 3B and 3C, according to one embodiment. As discussed briefly above and shown in FIG. 3D, the $1^{st}$ through $16^{th}$ neurons 105F generate sixteen partial output values 312 (shown in the top one-half of FIG. 3D). Similarly, the $33^{rd}$ through $48^{th}$ neuron 105F generate another sixteen partial output values 312 (shown in the bottom one-half of FIG. 3D). As mentioned above, neurons 17-32 and 49-64 are not utilized in this example.

In order to generate the sixteen output values 204, the neurons 105F utilize the accumulators 172 to sum the partial output values 312. In particular, the partial output values 312 generated by the neurons 105F in each group are summed. Accordingly, and as shown in FIG. 3D, the partial output values 312 generated by the $1^{st}$ and $33^{rd}$ neurons 105F are summed to generate the output value 204A. Similarly, the partial output values 312 generated by the $2^{nd}$ and $34^{th}$ neurons 105F are summed to generate the output value 204B. The remainder of the output values 204C-204P can be generated in a similar manner by summing the partial output values 312 generated by the neurons 105F in their respective neuron groups.

As mentioned above, the partitioning mechanism illustrated in FIGS. 3A-3D utilizes twice the number of neurons 105F as in the example described with regard to FIGS. 2A and 2B. As a result, convolution of the input volume 200 and weight volume 204 using this mechanism completes in roughly one-half the time required by the mechanism shown in FIGS. 2A and 2B. In particular, the example shown in FIGS. 3A-3D requires 2305 cycles to complete (i.e. 3×3× 256+one cycle to sum the partial output values 312 as shown in FIG. 3D). However, thirty-two neurons still remain idle in this example. The partitioning scheme described below with regard to FIGS. 4A-4E enables all of the 64 neurons 105F to be utilized, thereby saving additional power.

Figure 4A:
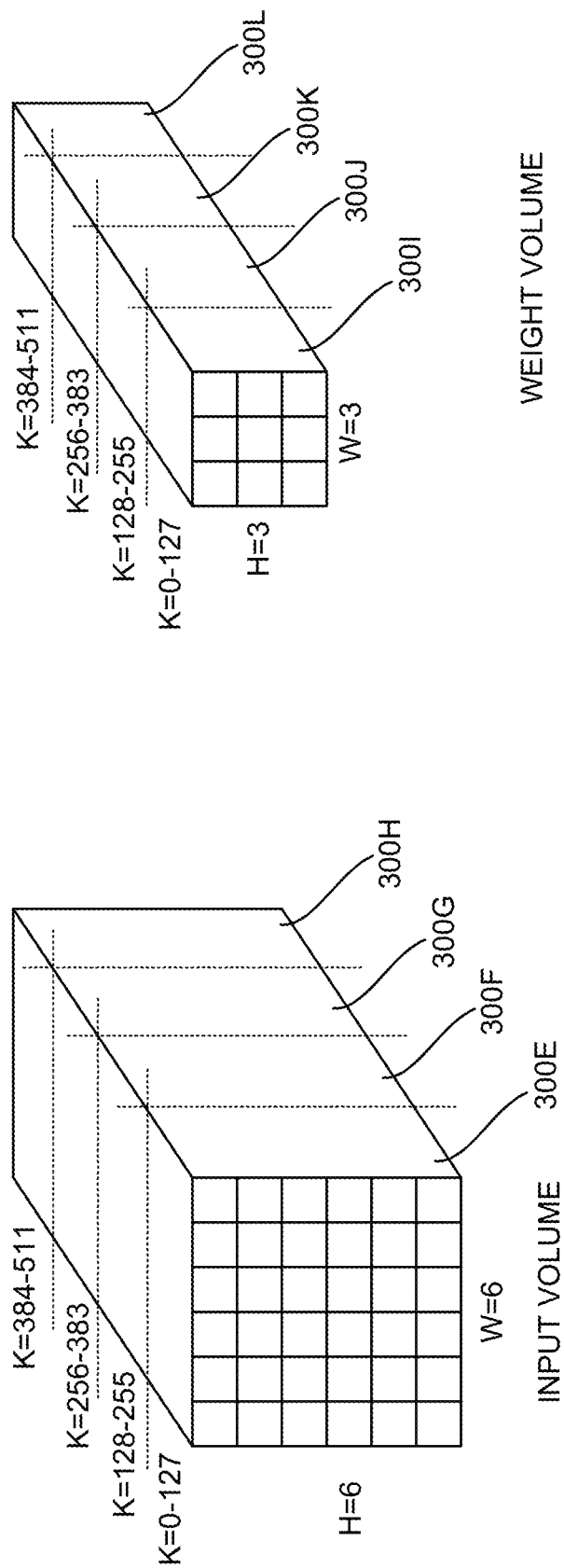
FIG. 4A is a data structure diagram that shows another illustrative partitioning of the exemplary input volume and weight volume shown in FIG. 2A, according to one embodiment.

FIG. 4A is a data structure diagram that shows another illustrative partitioning of the exemplary input volume 200 and weight volume 202 shown in FIG. 1A, according to one embodiment. In this example, the group partitioner and scheduler 166 has divided the input volume equally into four partitions 300E-300H. The DNN module 105 also has 64 neurons 105F in this example.

The group partitioner and scheduler 166 has also divided the weight volume 202 into four equally-sized partitions 300I-300L. As will be described in greater detail below with regard to FIGS. 4B-4D, partitioning the input volume 200 and the weight volume 202 in this manner can enable four times as many (i.e. 64) neurons 105F to perform the convolution operation described above with regard to FIG. 2B, thereby resulting in completion of the convolution operation in roughly one-quarter the time. This partitioning scheme also allows the processing of the convolution operation to complete twice as fast as when using the partitioning shown in FIGS. 2A-2D.

Figure 4B:
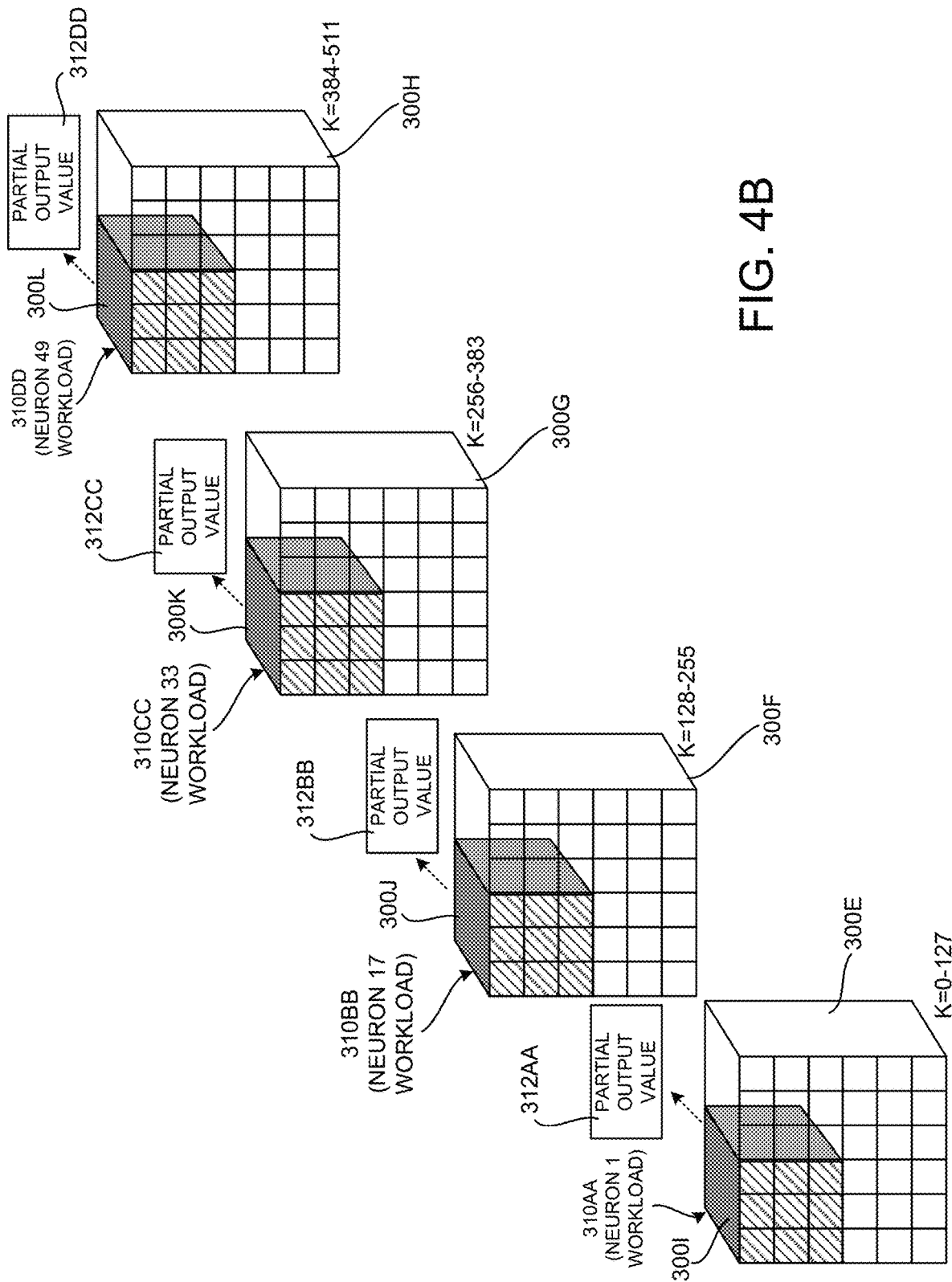
FIG. 4B is a data structure diagram illustrating aspects of the processing of several illustrative workloads during an illustrative convolution operation using the illustrative partitioning shown in FIG. 4A, according to one embodiment.

FIG. 4B is a data structure diagram illustrating aspects of the processing of several illustrative workloads 310 during a convolution operation using the illustrative partitioning shown in FIG. 4A, according to one embodiment. Once the group partitioner and scheduler 166 has partitioned the input volume 200 and the weight volume 202 in the manner shown in FIG. 4B, the group partitioner and scheduler 166 assigns workloads 310 defined by the partitions 300 to groups of the neurons 105F.

In the example shown in FIG. 4B, groups of four neurons 105F are responsible for generating each output value 204. For instance, a group consisting of the first, $17^{th}$, $33^{rd}$, and $49^{th}$ neurons 105F has been assigned the workloads 310AA, 310BB, 310CC, and 310DD, respectively, in this example. Similarly, and as shown in FIG. 4C, a group consisting of the $2^{nd}$, $18^{th}$, $34^{th}$, and $50^{th}$ neurons 105F has been assigned the workloads 310EE, 310FF, 310GG, 310HH, respectively.

Figure 4D:
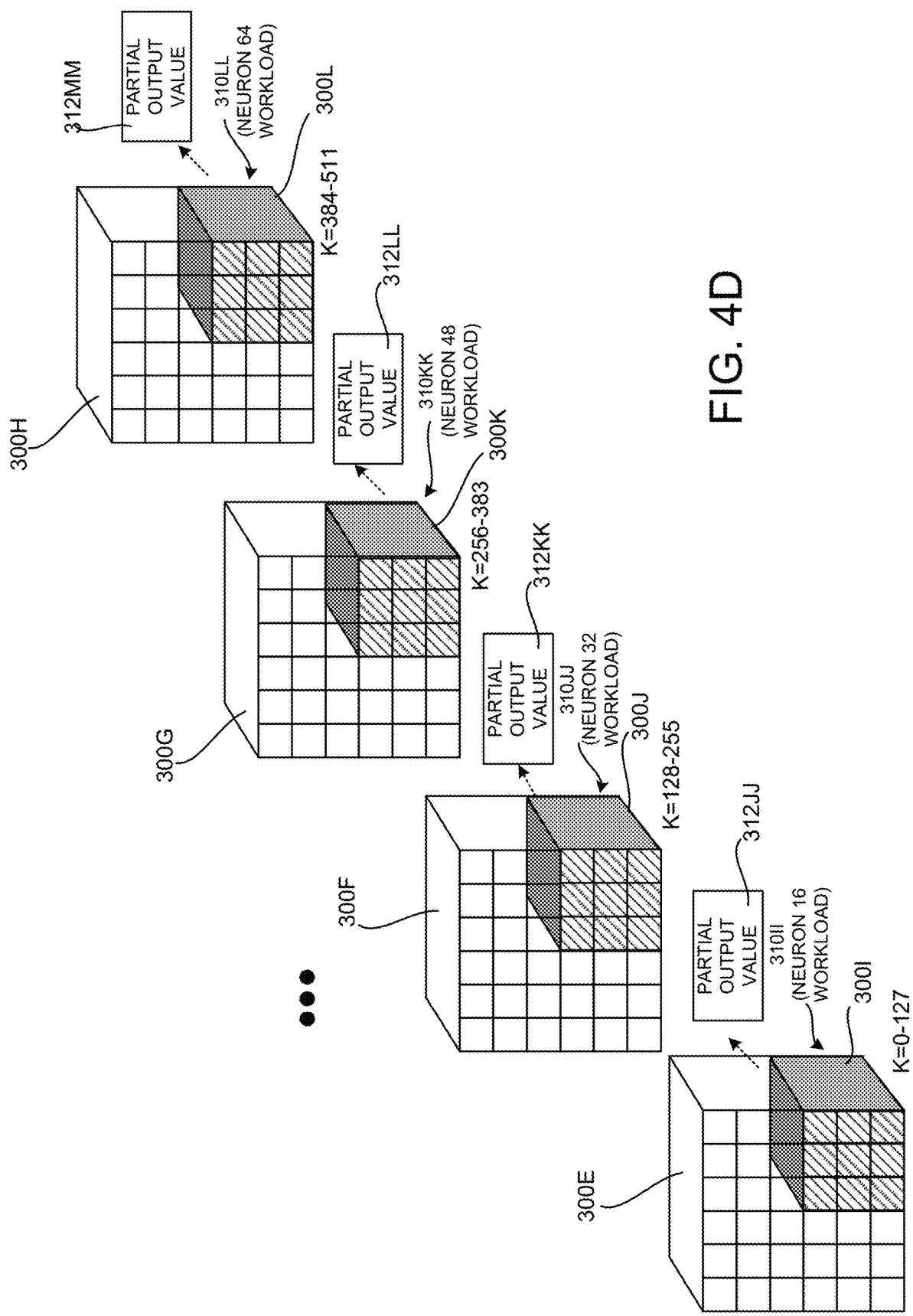
FIG. 4D is a data structure diagram illustrating aspects of the processing of several additional illustrative workloads during the illustrative convolution operation using the illustrative partitioning shown in FIG. 4A, according to one embodiment.

Other groups of neurons 105F can be assigned workloads 310 in a similar manner to perform the entire convolution operation and generate the 16 output values 204. For instance, and as shown in FIG. 4D, a group consisting of the $16^{th}$, $32^{nd}$, $48^{th}$, and $64^{th}$ neurons can be assigned the workloads 310II, 310JJ, 310KK, and 300LL respectively. In the example shown in FIGS. 4A-4D, all of the 64 neurons 105F in the DNN module 105 are utilized to perform the illustrative convolution operation.

As shown in FIGS. 4B-4D, the processing performed by each neuron 105F in each group of neurons 105F results in a partial output value 312. For example, and as shown in FIG. 4B, the workload 310AA processed by the first neuron 105F results in the partial output value 312AA. Similarly, the workload 310BB processed by the $17^{th}$ neuron 105F results in the partial output value 312BB. Likewise, the workloads 300CC and 300DD result in partial output values 312CC and 312DD, respectively. In a similar fashion, the workloads 310EE-310HH shown in FIGS. 4C and 4D result in partial output values 312EE-312MM. As discussed above, the partial output values 312 generated by each group of neurons 105F must be combined with one or more other partial output values 312 to arrive at a final output value 204.

Sixty-four partial output values 312 are generated by the partitioning and processing described above with regard to FIGS. 4A-4D. Consequently, the partial output values 312 must be combined in order to generate the sixteen output values 204. Details regarding one embodiment of this process are described below with regard to FIG. 4E.

Figure 4E:
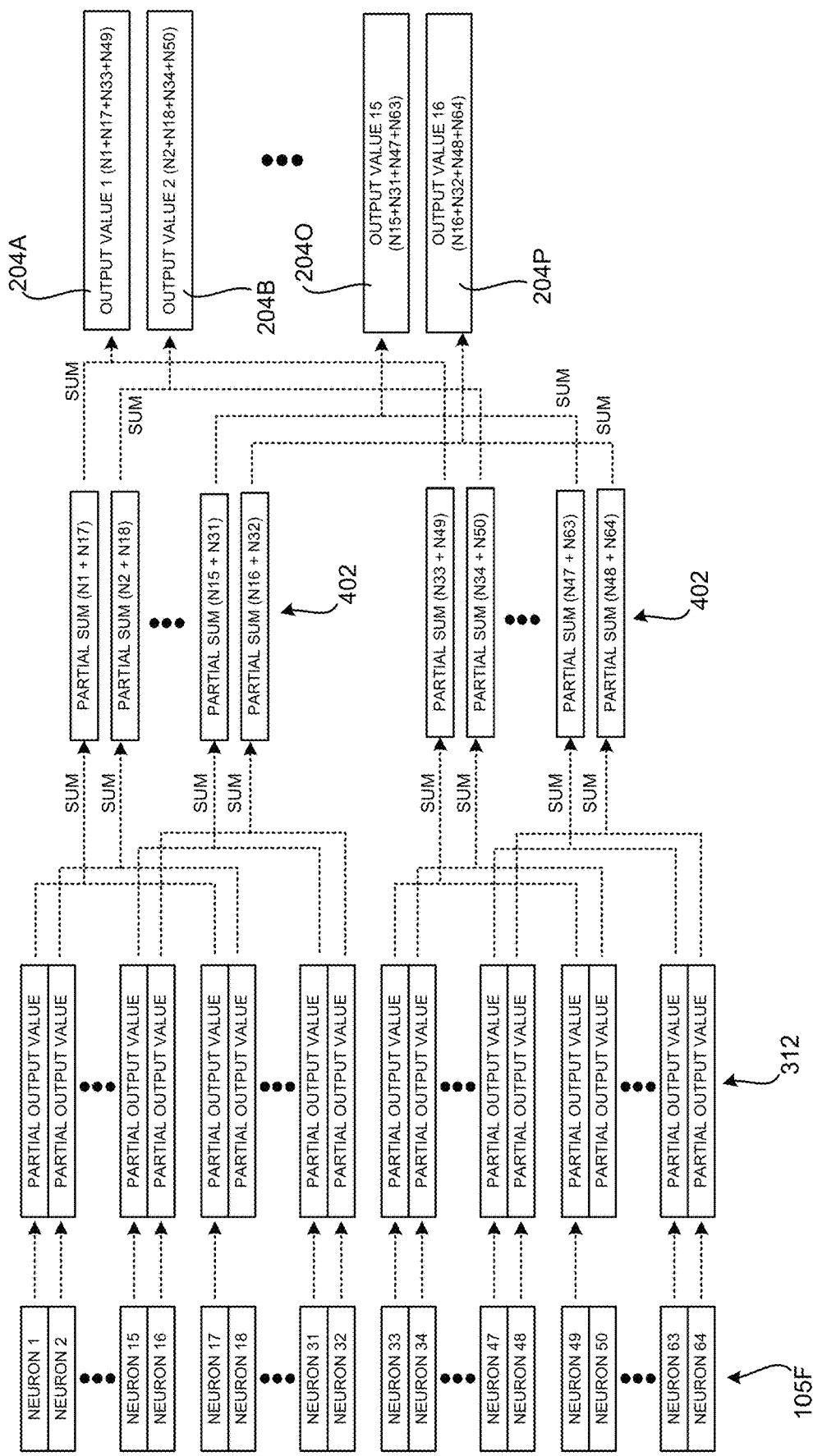
FIG. 4E is a processing diagram illustrating the generation of output values using partial output values generated by the processing of the partitioned workloads described with regard to FIGS. 4B-4D, according to one embodiment.

FIG. 4E is a processing diagram illustrating the generation of final output values 204 using partial output values 312 generated by the processing of the partitioned workloads described with regard to FIGS. 4B-4D, according to one embodiment. As discussed above and shown in FIG. 4E, all 64 neurons 105F in the DNN module 105 generate partial output values 312 in this embodiment.

In order to generate the sixteen output values 204, the neurons 105F utilize the accumulators 172 to sum the partial output values 312. In the embodiment shown in FIG. 4E, partial sums 402 are generated prior to generating the final output values 204. In particular, the partial output values 312 generated by the first two neurons 105F in each group are summed to generate partial sums 402. For instance, in the example shown in FIG. 4E, the partial output value 312 generated by the $1^{st}$ neuron 105F and the partial output value generated by the $17^{th}$ neuron 105F are summed to generate a partial sum 402. Likewise, the partial output value 312 generated by the $2^{nd}$ and $18^{th}$ neurons are summed to create a partial sum 402.

In the embodiment shown in FIG. 4E, the partial output values 312 generated by the third and fourth neuron 105F in each group are also summed to generate a partial sum 402. For instance, in the example shown in FIG. 4E, the partial output value 312 generated by the $33^{rd}$ neuron 105F and the partial output value generated by the $49^{th}$ neuron 105F are summed to generate a partial sum 402. Likewise, the partial output value 312 generated by the $34^{th}$ and $50^{th}$ neurons are summed to create a partial sum 402.

As shown in FIG. 4E, the partial sums 402 generated by different neurons 105F in each group of neurons are summed in order to arrive at the final output values 204. For instance, in this example the partial sum of the partial output values generated by the $1^{st}$ and $17^{th}$ neurons 105F are summed with the partial sum 402 of the partial output values 312 generated by the $33^{rd}$ and $49^{th}$ neurons to generate the output value 204A. Likewise, the partial sum of the partial output values generated by the $2^{nd}$ and $18^{th}$ neurons 105F are summed with the partial sum 402 of the partial output values 312 generated by the $34^{th}$ and $50^{th}$ neurons to generate the output value 204B. The output values 204O and 204P can be generated in a similar fashion.

As mentioned above, the partitioning mechanism illustrated in FIGS. 4A-4E utilizes four times the number of neurons 105F as in the example described above with regard to FIGS. 2A and 2B. As a result, convolution of the input volume 200 and weight volume 204 using this mechanism completes in roughly one-fourth the time required by the mechanism shown in FIGS. 2A and 2B. In particular, the example shown in FIGS. 4A-4E requires just 1154 cycles to complete (i.e. 3×3×128+two cycles to sum the partial output values 312 as shown in FIG. 4E). As discussed above, this enables the neurons 105F to be powered down more quickly, thereby saving power.

It is to be appreciated that while the embodiments disclosed herein have been presented in connection with a DNN module 105 that has 64 neurons 105F, the embodiments disclosed herein can be utilized with different numbers of neurons 105F. It is also to be appreciated that while the embodiments described above have been presented in conjunction with equally-sized partitions, non-equally-sized partitions can be utilized in other embodiments so long as the size of the partitions of the input volume 200 are the same size as the partitions of the weight volume 202.

It is to be further appreciated that the example mechanisms for aggregating the partial sums 402 shown in FIGS. 3D and 4E are merely illustrative. Other mechanisms can be utilized in other embodiments. For example, and without limitation, the second half of the partial sums 402 can be added into the first half and then the second quarter of the partial sums 402 can be added into the first quarter, and so on. This strategy might be beneficial in reducing the number of wires needed to implement the partial output aggregation mechanism in hardware.

Figure 5:
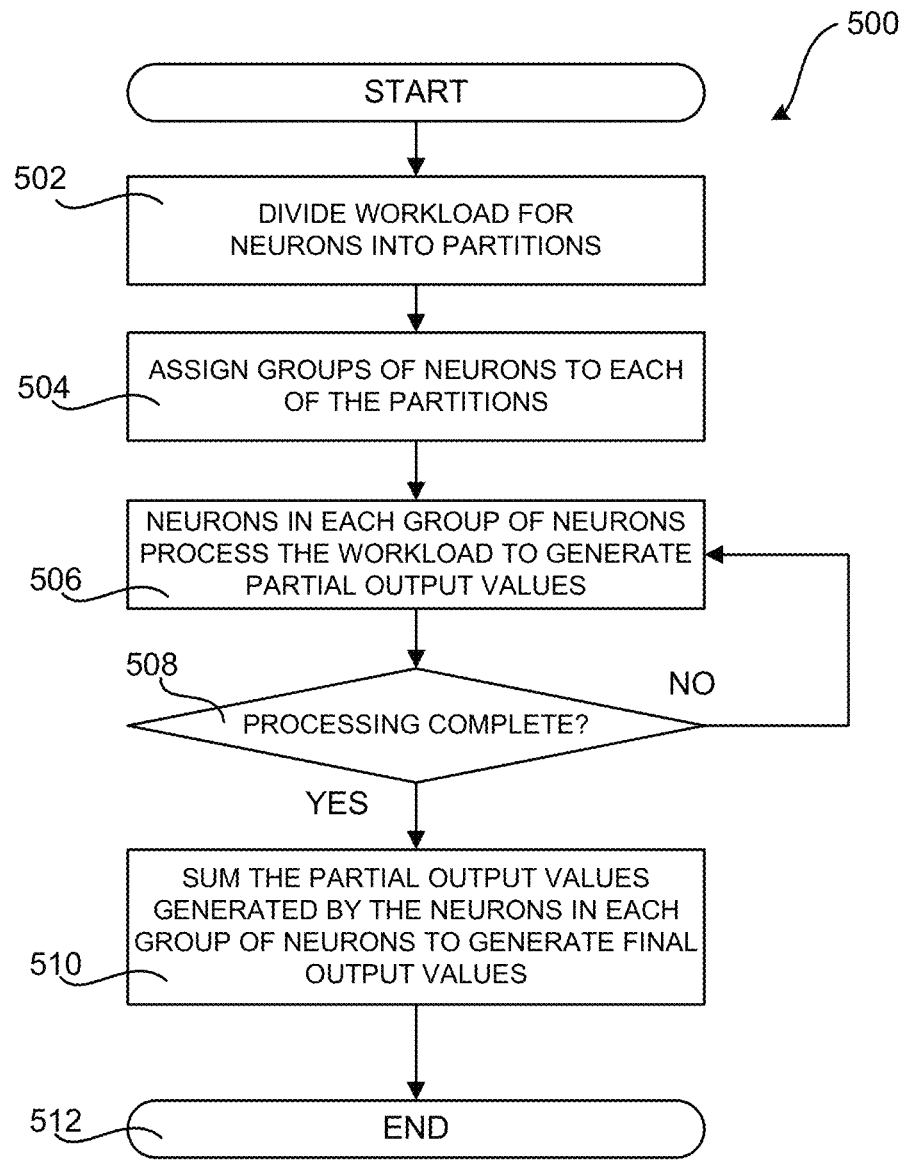
FIG. 5 is a flow diagram showing a routine that illustrates aspects of the operation of the DNN module described with reference to FIGS. 1A-4E, according to one embodiment disclosed herein.

FIG. 5 is a flow diagram showing a routine 500 that illustrates aspects of the operation of the DNN module 105 described with reference to FIGS. 1A-4E, according to one embodiment disclosed herein. It should be appreciated that the logical operations described herein with regard to FIG. 5, and the other FIGS., can be implemented (1) as a sequence of computer implemented acts or program modules running on a computing device and/or (2) as interconnected machine logic circuits or circuit modules within a computing device.

The particular implementation of the technologies disclosed herein is a matter of choice dependent on the performance and other requirements of the computing device. Accordingly, the logical operations described herein are referred to variously as states, operations, structural devices, acts, or modules. These states, operations, structural devices, acts and modules can be implemented in hardware, software, firmware, in special-purpose digital logic, and any combination thereof. It should be appreciated that more or fewer operations can be performed than shown in the FIGS. and described herein. These operations can also be performed in a different order than those described herein.

The routine 500 begins at operation 502, where the group partitioner and scheduler 166 divides the workload for the neurons 105F into partitions 300. As discussed above, this can include partitioning the input volume 200 and the weight volume 204 into a number of partitions that maximizes the number of neurons 105F of the DNN module 105 that can process the workload. As discussed above, the group partitioner and scheduler 166 can partition the workload into two or more partitions as appropriate.

From operation 502, the routine 500 proceeds to operation 504, where the group partitioner and scheduler 166 assigns groups of neurons 105F to each of the partitions 300. For example, and without limitation, groups of two neurons 105F can be assigned to process different portions of the workload when two partitions are utilized. Similarly, groups of four neurons 105F can be assigned to process different portions of the workload when four partitions are utilized. In general, groups of N neurons 105F are utilized to process a workload that has been partitioned into N partitions.

From operation 504, the routine 500 proceeds to operation 506, where the neurons 105F in each group of neurons 105F process their assigned workload to generate partial output values 312. When the neurons 105F have finished their processing, the routine 500 proceeds from operation 508 to operation 510, where the neurons 105F sum the partial output values 312 generated by the neurons 105F in each group of neurons 105F to generate the final output values 204. As discussed above with regard to FIG. 4E, it might be necessary to generate partial sums 402 and to sum the partial sums 402 to generate the final output values 204, depending upon the number of partitions 300. From operation 510, the routine 500 proceeds to operation 512, where it ends.

Figure 6:
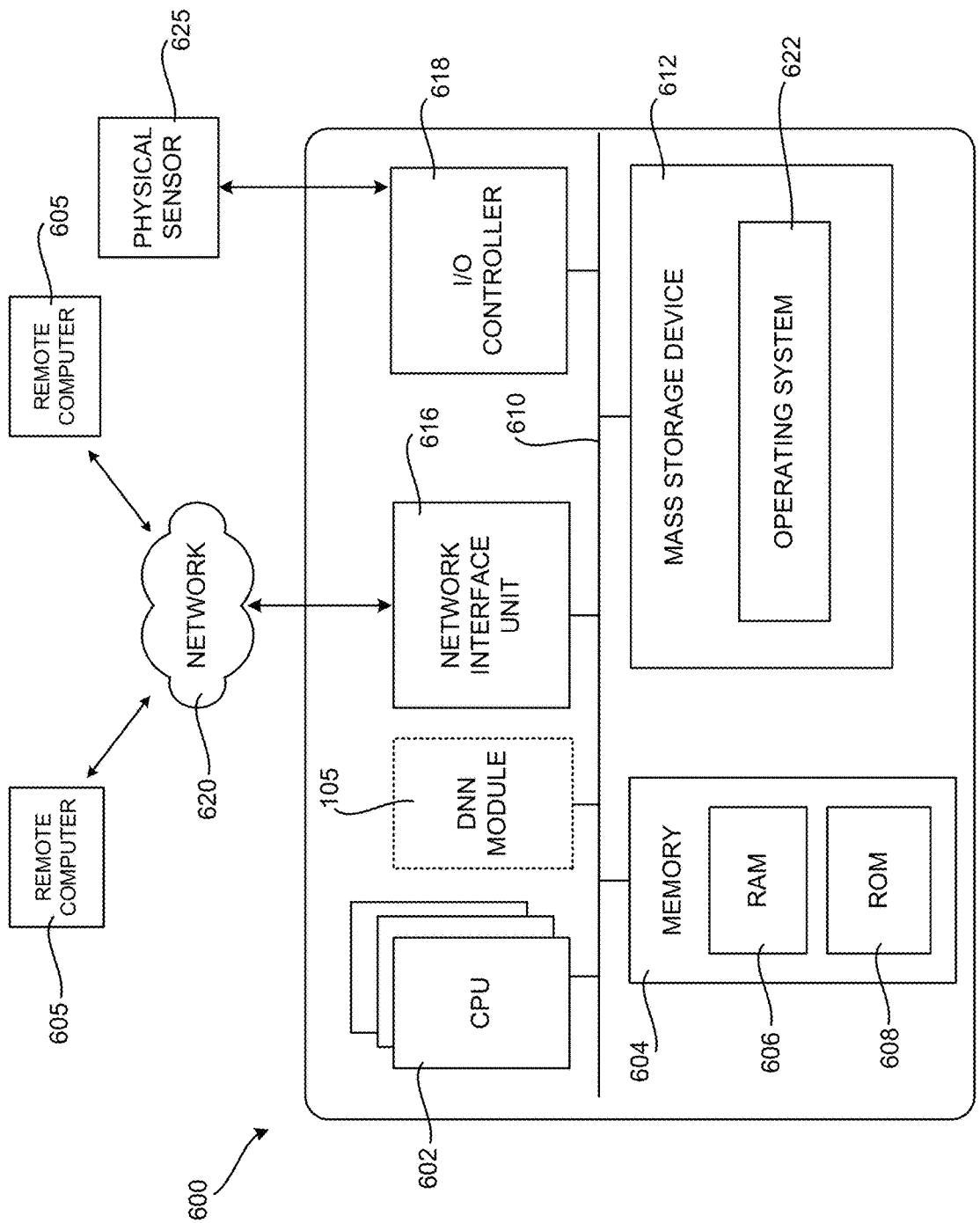
FIG. 6 is a computer architecture diagram showing an illustrative computer hardware and software architecture for a computing device that can act as an application host for the DNN module presented herein, according to one embodiment.

FIG. 6 is a computer architecture diagram showing an illustrative computer hardware and software architecture for a computing device that can act as an application host for the DNN module 105 presented herein. In particular, the architecture illustrated in FIG. 6 can be utilized to implement a server computer, mobile phone, an e-reader, a smartphone, a desktop computer, an AR/VR device, a tablet computer, a laptop computer, or another type of computing device suitable for use with the DNN module 105.

The computer 600 illustrated in FIG. 6 includes a central processing unit 602 ("CPU"), a system memory 604, including a random-access memory 606 ("RAM") and a read-only memory ("ROM") 608, and a system bus 610 that couples the memory 604 to the CPU 602. A basic input/output system ("BIOS" or "firmware") containing the basic routines that help to transfer information between elements within the computer 600, such as during startup, can be stored in the ROM 608. The computer 600 further includes a mass storage device 612 for storing an operating system 622, application programs, and other types of programs. The mass storage device 612 can also be configured to store other types of programs and data.

The mass storage device 612 is connected to the CPU 602 through a mass storage controller (not shown) connected to the bus 610. The mass storage device 612 and its associated computer readable media provide non-volatile storage for the computer 600. Although the description of computer readable media contained herein refers to a mass storage device, such as a hard disk, CD-ROM drive, DVD-ROM drive, or USB storage key, it should be appreciated by those skilled in the art that computer readable media can be any available computer storage media or communication media that can be accessed by the computer 600.

Communication media includes computer readable instructions, data structures, program modules, or other data in a modulated data signal such as a carrier wave or other transport mechanism and includes any delivery media. The term "modulated data signal" means a signal that has one or more of its characteristics changed or set in a manner so as to encode information in the signal. By way of example, and not limitation, communication media includes wired media such as a wired network or direct-wired connection, and wireless media such as acoustic, radio frequency, infrared and other wireless media. Combinations of the any of the above should also be included within the scope of computer readable media.

By way of example, and not limitation, computer storage media can include volatile and non-volatile, removable and non-removable media implemented in any method or technology for storage of information such as computer readable instructions, data structures, program modules or other data. For example, computer storage media includes, but is not limited to, RAM, ROM, EPROM, EEPROM, flash memory or other solid-state memory technology, CD-ROM, digital versatile disks ("DVD"), HD-DVD, BLU-RAY, or other optical storage, magnetic cassettes, magnetic tape, magnetic disk storage or other magnetic storage devices, or any other medium that can be used to store the desired information and which can be accessed by the computer 600. For purposes of the claims, the phrase "computer storage medium," and variations thereof, does not include waves or signals per se or communication media.

According to various configurations, the computer 600 can operate in a networked environment using logical connections to remote computers through a network such as the network 620. The computer 600 can connect to the network 620 through a network interface unit 616 connected to the bus 610. It should be appreciated that the network interface unit 616 can also be utilized to connect to other types of networks and remote computer systems. The computer 600 can also include an input/output controller 618 for receiving and processing input from a number of other devices, including a keyboard, mouse, touch input, an electronic stylus (not shown in FIG. 6), or a physical sensor such as a video camera. Similarly, the input/output controller 618 can provide output to a display screen or other type of output device (also not shown in FIG. 6).

It should be appreciated that the software components described herein, when loaded into the CPU 602 and executed, can transform the CPU 602 and the overall computer 600 from a general-purpose computing device into a special-purpose computing device customized to facilitate the functionality presented herein. The CPU 602 can be constructed from any number of transistors or other discrete circuit elements, which can individually or collectively assume any number of states. More specifically, the CPU 602 can operate as a finite-state machine, in response to executable instructions contained within the software modules disclosed herein. These computer-executable instructions can transform the CPU 602 by specifying how the CPU 602 transitions between states, thereby transforming the transistors or other discrete hardware elements constituting the CPU 602.

Encoding the software modules presented herein can also transform the physical structure of the computer readable media presented herein. The specific transformation of physical structure depends on various factors, in different implementations of this description. Examples of such factors include, but are not limited to, the technology used to implement the computer readable media, whether the computer readable media is characterized as primary or secondary storage, and the like. For example, if the computer readable media is implemented as semiconductor-based memory, the software disclosed herein can be encoded on the computer readable media by transforming the physical state of the semiconductor memory. For instance, the software can transform the state of transistors, capacitors, or other discrete circuit elements constituting the semiconductor memory. The software can also transform the physical state of such components in order to store data thereupon.

As another example, the computer readable media disclosed herein can be implemented using magnetic or optical technology. In such implementations, the software presented herein can transform the physical state of magnetic or optical media, when the software is encoded therein. These transformations can include altering the magnetic characteristics of particular locations within given magnetic media. These transformations can also include altering the physical features or characteristics of particular locations within given optical media, to change the optical characteristics of those locations. Other transformations of physical media are possible without departing from the scope and spirit of the present description, with the foregoing examples provided only to facilitate this discussion.

In light of the above, it should be appreciated that many types of physical transformations take place in the computer 600 in order to store and execute the software components presented herein. It also should be appreciated that the architecture shown in FIG. 6 for the computer 600, or a similar architecture, can be utilized to implement other types of computing devices, including hand-held computers, video game devices, embedded computer systems, mobile devices such as smartphones, tablets, and AR/VR devices, and other types of computing devices known to those skilled in the art. It is also contemplated that the computer 600 might not include all of the components shown in FIG. 6, can include other components that are not explicitly shown in FIG. 6, or can utilize an architecture completely different than that shown in FIG. 6.

Figure 7:
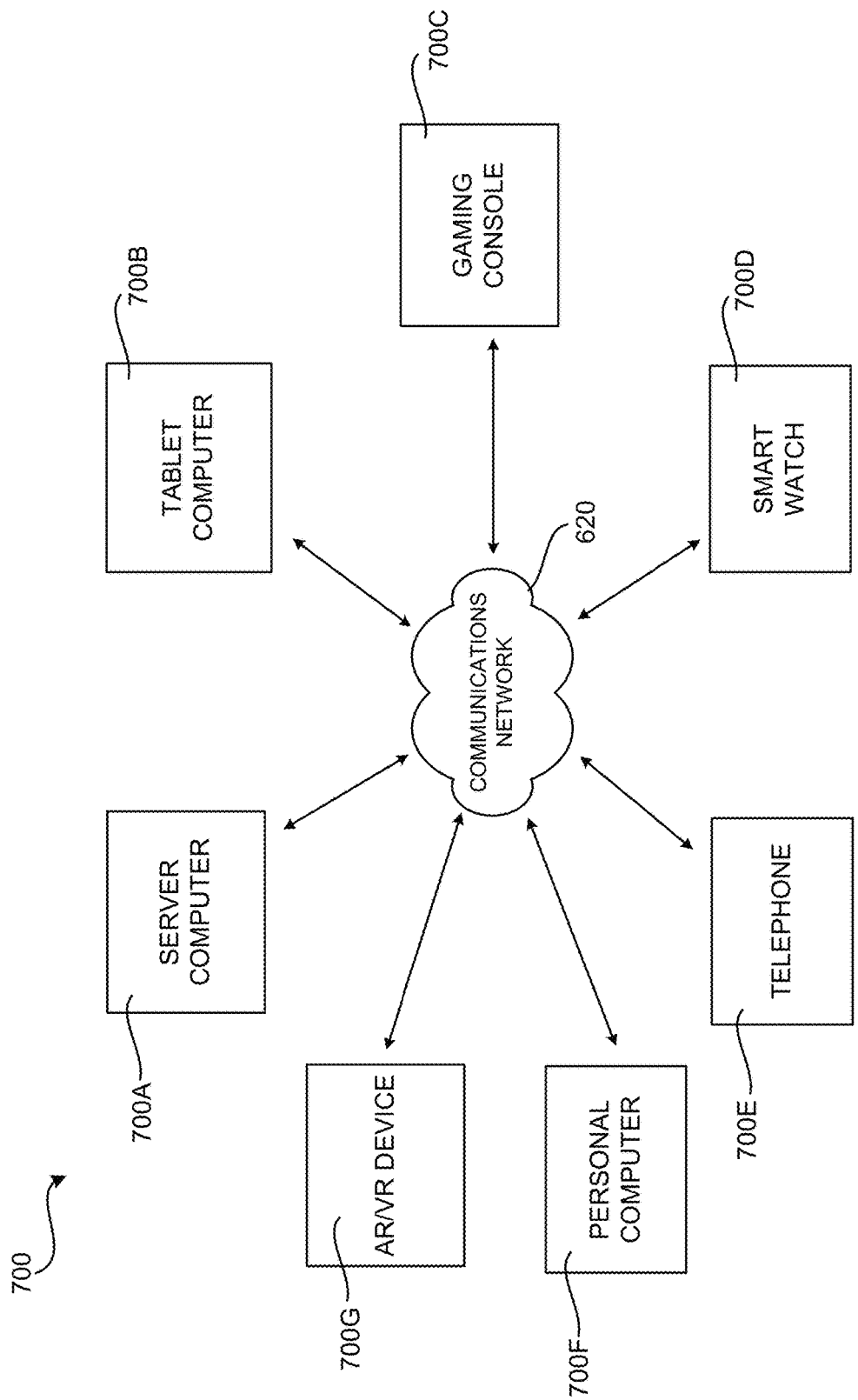
FIG. 7 is a network diagram illustrating a distributed computing environment in which aspects of the disclosed technologies can be implemented, according to various embodiments presented herein.

FIG. 7 is a network diagram illustrating a distributed network computing environment 700 in which aspects of the disclosed technologies can be implemented, according to various embodiments presented herein. As shown in FIG. 7, one or more server computers 700A can be interconnected via a communications network 620 (which may be either of, or a combination of, a fixed-wire or wireless LAN, WAN, intranet, extranet, peer-to-peer network, virtual private network, the Internet, Bluetooth communications network, proprietary low voltage communications network, or other communications network) with a number of client computing devices such as, but not limited to, a tablet computer 700B, a gaming console 700C, a smart watch 700D, a telephone 700E, such as a smartphone, a personal computer 700F, and an AR/VR device 700G.

In a network environment in which the communications network 620 is the Internet, for example, the server computer 700A can be a dedicated server computer operable to process and communicate data to and from the client computing devices 700B-700G via any of a number of known protocols, such as, hypertext transfer protocol ("HTTP"), file transfer protocol ("FTP"), or simple object access protocol ("SOAP"). Additionally, the networked computing environment 700 can utilize various data security protocols such as secured socket layer ("SSL") or pretty good privacy ("PGP"). Each of the client computing devices 700B-700G can be equipped with an operating system operable to support one or more computing applications or terminal sessions such as a web browser (not shown in FIG. 7), or other graphical user interface (not shown in FIG. 7), or a mobile desktop environment (not shown in FIG. 7) to gain access to the server computer 700A.

The server computer 700A can be communicatively coupled to other computing environments (not shown in FIG. 7) and receive data regarding a participating user's interactions/resource network. In an illustrative operation, a user (not shown in FIG. 7) may interact with a computing application running on a client computing device 700B-700G to obtain desired data and/or perform other computing applications.

The data and/or computing applications may be stored on the server 700A, or servers 700A, and communicated to cooperating users through the client computing devices 700B-700G over an exemplary communications network 620. A participating user (not shown in FIG. 7) may request access to specific data and applications housed in whole or in part on the server computer 6800A. These data may be communicated between the client computing devices 700B-700G and the server computer 700A for processing and storage.

The server computer 700A can host computing applications, processes and applets for the generation, authentication, encryption, and communication of data and applications, and may cooperate with other server computing environments (not shown in FIG. 7), third party service providers (not shown in FIG. 7), network attached storage ("NAS") and storage area networks ("SAN") to realize application/data transactions.

It should be appreciated that the computing architecture shown in FIG. 6 and the distributed network computing environment shown in FIG. 7 have been simplified for ease of discussion. It should also be appreciated that the computing architecture and the distributed computing network can include and utilize many more computing components, devices, software programs, networking devices, and other components not specifically described herein.

The disclosure presented herein also encompasses the subject matter set forth in the following clauses:

Clause 1. A neural network processor, comprising: a plurality of neurons; and a group partitioner and scheduler unit configured to divide a workload for the neural network processor into a plurality of partitions, and assign a group of the neurons to each of the plurality of partitions; and wherein the neurons within each group of neurons are configured to process the workload in an assigned partition to generate a partial output value, and sum partial output values generated by the neurons in each group of neurons to generate an output value for the workload.

Clause 2. The neural network processor of clause 1, wherein the workload comprises an input volume and a weight volume having height, width, and depth dimensions, and wherein the workload is partitioned along the depth dimension.

Clause 3. The neural network processor of any of clauses 1 and 2, wherein the workload comprises an input volume and a weight volume having height, width, and depth dimensions, and wherein the workload is partitioned along the height dimension.

Clause 4. The neural network processor of any of clauses 1-3, wherein the workload comprises an input volume and a weight volume having height, width, and depth dimensions, and wherein the workload is partitioned along the width dimension.

Clause 5. The neural network processor of any of clauses 1-4, wherein the workload is divided into a plurality of partitions such that the number of neurons that can simultaneously process the workload is maximized.

Clause 6. The neural network processor of any of clauses 1-5, wherein processing the workload comprises performing a convolution operation on a portion of an input volume and a portion of a weight operation in the partition.

Clause 7. The neural network processor of any of clauses 1-6, wherein the plurality of neurons are powered down following generation of the output values for the workload.

Clause 8. A neural network processor, comprising: a buffer storing an input volume and a weight volume; a plurality of neurons; and a group partitioner and scheduler configured to partition the input volume and the weight volume into a plurality of partitions, and assign a group of the neurons to each of the plurality of partitions; and wherein the neurons within each group of neurons are configured to process a workload defined by an assigned partition to generate a partial output value, and sum partial output values generated by the neurons in each group of neurons to generate an output value for the workload.

Clause 9. The neural network processor of clause 8, wherein the workload is divided into a plurality of partitions such that the number of neurons that can simultaneously process the workload is maximized.

Clause 10. The neural network processor of any of clauses 8 and 9, wherein the workload comprises an input volume and a weight volume having height, width, and depth dimensions, and wherein the workload is partitioned along the depth dimension.

Clause 11. The neural network processor of any of clauses 8-10, wherein the workload comprises an input volume and a weight volume having height, width, and depth dimensions, and wherein the workload is partitioned along the height dimension.

Clause 12. The neural network processor of any of clauses 8-11, wherein the workload comprises an input volume and a weight volume having height, width, and depth dimensions, and wherein the workload is partitioned along the width dimension.

Clause 13. The neural network processor of any of clauses 8-12, wherein the plurality of neurons are powered down following generation of the output values for the workload.

Clause 14. A computer-implemented method, comprising: dividing a workload for a neural network processor into a plurality of partitions; assigning a group of neurons of the neural network processor to each of the plurality of partitions; processing, by way of the group of neurons, the workload in an assigned partition to generate a partial output value; and summing partial output values generated by the neurons in each group of neurons to generate an output value for the workload.

Clause 15. The computer-implemented method of clause 14, wherein the workload comprises an input volume and a weight volume having height, width, and depth dimensions, and wherein the workload is partitioned along the depth dimension.

Clause 16. The computer-implemented method of any of clauses 14 and 15, wherein the workload comprises an input volume and a weight volume having height, width, and depth dimensions, and wherein the workload is partitioned along the height dimension.

Clause 17. The computer-implemented method of any of clauses 14-16, wherein the workload comprises an input volume and a weight volume having height, width, and depth dimensions, and wherein the workload is partitioned along the width dimension.

Clause 18. The computer-implemented method of any of clauses 14-17, wherein the workload is divided into a plurality of partitions such that the number of neurons that can simultaneously process the workload is maximized.

Clause 19. The computer-implemented method of any of clauses 14-18, wherein processing the workload comprises performing a convolution operation on a portion of an input volume and a portion of a weight operation in the partition.

Clause 20. The computer-implemented method of any of clauses 14-19, further comprising powering down the plurality of neurons following generation of the output values for the workload.

Based on the foregoing, it should be appreciated that a DNN module that can dynamically partitioning neuron workload to reduce power consumption has been disclosed herein. Although the subject matter presented herein has been described in language specific to computer structural features, methodological and transformative acts, specific computing machinery, and computer readable media, it is to be understood that the subject matter set forth in the appended claims is not necessarily limited to the specific features, acts, or media described herein. Rather, the specific features, acts and mediums are disclosed as example forms of implementing the claimed subject matter.

The subject matter described above is provided by way of illustration only and should not be construed as limiting. Various modifications and changes can be made to the subject matter described herein without following the example configurations and applications illustrated and described, and without departing from the scope of the present disclosure, which is set forth in the following claims.

What is claimed is:

1. A neural network processor, comprising:
a plurality of neurons; and
a group partitioner and scheduler configured to:
divide a workload for the neural network processor into a plurality of partitions based on a quantity of the plurality of neurons, and
assign a group of the neurons to each of the plurality of partitions to maximize a total number of the plurality of neurons that simultaneously process the workload while reducing power consumption; and
wherein the neurons within each group of neurons are configured to:
process the workload in an assigned partition to generate a partial output value by
performing a convolution operation on a partition containing a portion of an input volume and a portion of a weight volume where the partition comprises an input frame defined by a set of kernels, a number of channels per kernel, a height, and a width, and
performing the convolution operation on overlapping intervals defined by strides in two dimensions; and
sum partial output values generated by the neurons in each group of neurons to generate an output value for the workload.

2. The neural network processor of claim 1, wherein the workload comprises an input volume and a weight volume having height, width, and depth dimensions, and wherein the workload is partitioned along the depth dimension.

3. The neural network processor of claim 1, wherein the workload comprises an input volume and a weight volume having height, width, and depth dimensions, and wherein the workload is partitioned along the height dimension.

4. The neural network processor of claim 1, wherein the workload comprises an input volume and a weight volume having height, width, and depth dimensions, and wherein the workload is partitioned along the width dimension.

5. The neural network processor of claim 1, wherein the workload is divided into a plurality of partitions such that the number of neurons that can simultaneously process the workload is maximized.

6. The neural network processor of claim 1, wherein the plurality of neurons are powered down following generation of the output values for the workload.

7. A neural network processor, comprising:
a buffer storing an input volume and a weight volume;
a plurality of neurons; and
a group partitioner and scheduler configured to
partition the input volume and the weight volume into a plurality of partitions based on a quantity of the plurality of neurons, and
assign a group of the neurons to each of the plurality of partitions to maximize a total number of the plurality of neurons that simultaneously process a workload while reducing power consumption; and
wherein the neurons within each group of neurons are configured to:
process the workload in an assigned partition to generate a partial output value by
performing a convolution operation on a partition containing a portion of an input volume and a portion of a weight volume where the partition comprises an input frame defined by a set of kernels, a number of channels per kernel, a height, and a width, and
performing the convolution operation on overlapping intervals defined by strides in two dimensions; and
sum partial output values generated by the neurons in each group of neurons to generate an output value for the workload.

8. The neural network processor of claim 7, wherein the workload is divided into a plurality of partitions such that the number of neurons that can simultaneously process the workload is maximized.

9. The neural network processor of claim 7, wherein the workload comprises an input volume and a weight volume having height, width, and depth dimensions, and wherein the workload is partitioned along the depth dimension.

10. The neural network processor of claim 7, wherein the workload comprises an input volume and a weight volume having height, width, and depth dimensions, and wherein the workload is partitioned along the height dimension.

11. The neural network processor of claim 7, wherein the workload comprises an input volume and a weight volume having height, width, and depth dimensions, and wherein the workload is partitioned along the width dimension.

12. The neural network processor of claim 7, wherein the plurality of neurons are powered down following generation of the output values for the workload.

13. A computer-implemented method, comprising:
dividing a workload for a neural network processor into a plurality of partitions based on a quantity of neurons of the neural network processor;
assigning a group of neurons of the neural network processor to each of the plurality of partitions to maximize a total number of the group of neurons that simultaneously process the workload while reducing power consumption;
processing, by way of the group of neurons, the workload in an assigned partition to generate a partial output value by:
performing a convolution operation on a partition containing a portion of an input volume and a portion of a weight volume where the partition comprises an input frame defined by a set of kernels, a number of channels per kernel, a height, and a width, and
performing the convolution operation on overlapping intervals defined by strides in two dimensions; and
summing partial output values generated by the neurons in each group of neurons to generate an output value for the workload.

14. The computer-implemented method of claim 13, wherein the workload comprises an input volume and a weight volume having height, width, and depth dimensions, and wherein the workload is partitioned along the depth dimension.

15. The computer-implemented method of claim 13, wherein the workload comprises an input volume and a weight volume having height, width, and depth dimensions, and wherein the workload is partitioned along the height dimension.

16. The computer-implemented method of claim 13, wherein the workload comprises an input volume and a weight volume having height, width, and depth dimensions, and wherein the workload is partitioned along the width dimension.

17. The computer-implemented method of claim 13, wherein the workload is divided into a plurality of partitions such that the number of neurons that can simultaneously process the workload is maximized.

18. The computer-implemented method of claim 13, further comprising powering down the group of neurons following generation of the output values for the workload.

* * * * *